(12) United States Patent
Yoshihara et al.

(10) Patent No.: US 9,947,534 B2
(45) Date of Patent: Apr. 17, 2018

(54) COATING TREATMENT METHOD WITH AIRFLOW CONTROL, AND NON-TRANSITORY RECORDING MEDIUM HAVING PROGRAM RECORDED THEREON FOR EXECUTING COATING TREATMENT WITH AIRFLOW CONTROL

(71) Applicant: TOKYO ELECTRON LIMITED, Minato-ku, Tokyo (JP)

(72) Inventors: Kousuke Yoshihara, Koshi (JP); Koji Takayanagi, Koshi (JP); Shinichi Hatakeyama, Koshi (JP); Kohei Kawakami, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 273 days.

(21) Appl. No.: 14/813,820

(22) Filed: Jul. 30, 2015

(65) Prior Publication Data

US 2015/0371853 A1 Dec. 24, 2015

Related U.S. Application Data

(62) Division of application No. 13/448,526, filed on Apr. 17, 2012, now Pat. No. 9,162,247.

(30) Foreign Application Priority Data

Apr. 26, 2011 (JP) .................................. 2011-098684
Mar. 6, 2012 (JP) .................................. 2012-049740

(51) Int. Cl.
*B05D 3/12* (2006.01)
*H01L 21/033* (2006.01)
(Continued)

(52) U.S. Cl.
CPC ........ *H01L 21/0337* (2013.01); *B05C 11/023* (2013.01); *B05D 1/005* (2013.01);
(Continued)

(58) Field of Classification Search
CPC . B05D 1/005; H01L 21/6715; H01L 51/0003; G03F 7/162
(Continued)

(56) References Cited

U.S. PATENT DOCUMENTS 3,902,857 A 9/1975 Vander Mey et al.
4,510,176 A 4/1985 Cuthbert et al.
(Continued)

FOREIGN PATENT DOCUMENTS

JP H05-283331 A 10/1993
JP 2001-157867 A 1/2006
(Continued)

*Primary Examiner* — Kirsten Jolley
(74) *Attorney, Agent, or Firm* — Posz Law Group, PLC

(57) ABSTRACT

A coating treatment apparatus supplying a coating solution to a front surface of a rotated substrate and diffusing the supplied coating solution to an outer periphery side of the substrate to thereby apply the coating solution on the front surface of the substrate includes: a substrate holding part holding a substrate; a rotation part rotating the substrate held on the substrate holding part; a supply part supplying a coating solution to a front surface of the substrate held on the substrate holding part; and an airflow control plate provided at a predetermined position above the substrate held on the substrate holding part for locally changing an airflow above the substrate rotated by the rotation part at an arbitrary position.

4 Claims, 22 Drawing Sheets

(51) Int. Cl.
*B05D 1/00* (2006.01)
*B05C 11/02* (2006.01)
*H01L 21/67* (2006.01)
*G03F 7/16* (2006.01)
*H01L 21/027* (2006.01)
*H01L 51/00* (2006.01)
*G06F 19/00* (2018.01)

(52) U.S. Cl.
CPC .......... *G03F 7/162* (2013.01); *H01L 21/0271* (2013.01); *H01L 21/6715* (2013.01); *G06F 19/00* (2013.01); *H01L 51/0003* (2013.01); *H01L 2224/03418* (2013.01)

(58) Field of Classification Search
USPC ....................................................... 427/240
See application file for complete search history.

(56) References Cited

U.S. PATENT DOCUMENTS

| | | | |
|---|---|---|---|
| 4,800,836 A | 1/1989 | Yamamoto et al. |
| 4,838,979 A | 6/1989 | Nishida et al. |
| 5,116,250 A | 5/1992 | Sago et al. |
| 5,199,988 A | 4/1993 | Kamezaki et al. |
| 5,211,753 A | 5/1993 | Swain |
| 5,358,740 A | 10/1994 | Bornside et al. |
| 5,366,757 A | 11/1994 | Lin |
| 5,395,649 A | 3/1995 | Ikeda |
| 5,405,813 A | 4/1995 | Rodrigues |
| 5,518,542 A | 5/1996 | Matsukawa et al. |
| 5,591,264 A | 1/1997 | Sugimoto et al. |
| 5,611,886 A | 3/1997 | Bachman et al. |
| 5,718,763 A | 2/1998 | Tateyama et al. |
| 5,927,303 A | 7/1999 | Miya et al. |
| 5,962,193 A | 10/1999 | Lin et al. |
| 5,997,653 A | 12/1999 | Yamasaka |
| 6,053,977 A | 4/2000 | Konishi |
| 6,261,635 B1 | 7/2001 | Shirley |
| 6,503,335 B2 | 1/2003 | Hohl et al. |
| 6,576,055 B2 | 6/2003 | Shirley |
| 6,740,163 B1 | 5/2004 | Curtiss et al. |
| 6,780,233 B1 | 8/2004 | Leigh et al. |
| 6,872,254 B2 | 3/2005 | Shirley |
| 6,979,474 B2 | 12/2005 | Matsuyama et al. |
| 7,199,062 B2 | 4/2007 | Wei |
| 7,543,593 B2 | 6/2009 | Orii et al. |
| 7,566,365 B2 | 7/2009 | Kobayashi et al. |
| 7,927,657 B2 | 4/2011 | Kobayashi et al. |
| 8,304,018 B2 | 11/2012 | Takayanagi et al. |
| 2001/0050050 A1 | 12/2001 | Nishiya et al. |
| 2004/0180142 A1 | 9/2004 | Kobayashi et al. |
| 2005/0173396 A1 | 8/2005 | Ooshima et al. |
| 2005/0284362 A1 | 12/2005 | Kim et al. |
| 2006/0048792 A1 | 3/2006 | Nakamura et al. |
| 2007/0105379 A1 | 4/2007 | Orii et al. |
| 2007/0116459 A1 | 5/2007 | Takeguchi et al. |
| 2008/0016714 A1 | 1/2008 | Kaneyama et al. |
| 2008/0092929 A1 | 4/2008 | Yokouchi |
| 2009/0071940 A1 | 3/2009 | Miyagi et al. |
| 2010/0151126 A1 | 6/2010 | Iseki et al. |
| 2010/0209607 A1 | 8/2010 | Takayanagi et al. |
| 2011/0135820 A1* | 6/2011 | Imamura ............. H01L 21/6715 427/240 |
| 2011/0189400 A1 | 8/2011 | Shinya |
| 2011/0189602 A1 | 8/2011 | Tadokoro et al. |
| 2012/0021611 A1 | 1/2012 | Yoshihara et al. |

FOREIGN PATENT DOCUMENTS

| | | |
|---|---|---|
| JP | 3890026 B2 | 12/2006 |
| JP | 2009-078250 A | 4/2009 |
| JP | 2010-212658 A | 9/2010 |

* cited by examiner

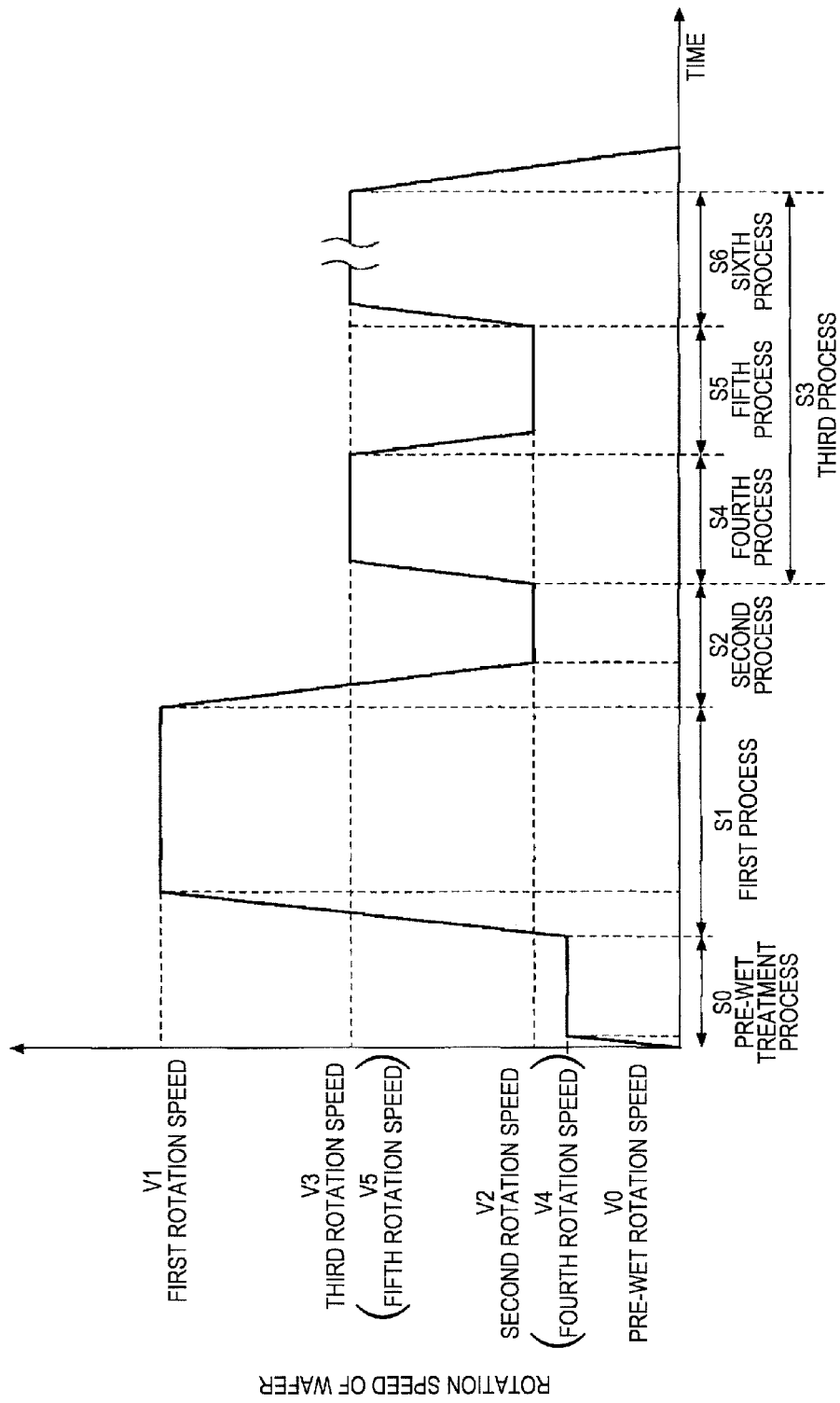

COATING TREATMENT METHOD WITH AIRFLOW CONTROL, AND NON-TRANSITORY RECORDING MEDIUM HAVING PROGRAM RECORDED THEREON FOR EXECUTING COATING TREATMENT WITH AIRFLOW CONTROL

CROSS REFERENCE TO RELATED APPLICATIONS

This application is a divisional of U.S. patent application Ser. No. 13/448,526 filed on Apr. 17, 2012, which is based upon and claims the benefit of priority of Japanese Patent Application No. 2011-098684, filed in Japan on Apr. 26, 2011, and Japanese Patent Application No. 2012-049740, filed in Japan on Mar. 6, 2012, the entire contents of which are incorporated herein by reference.

BACKGROUND OF THE INVENTION

1. Field of the Invention

The present invention relates to a coating treatment apparatus, a coating and developing treatment system, a coating treatment method, and a non-transitory recording medium having a program recorded thereon for executing the coating treatment method.

2. Description of the Related Art

In a photolithography process in a manufacturing process of a semiconductor device, a predetermined resist pattern is formed by sequentially performing coating treatment, exposure treatment and developing treatment on a substrate, namely, a wafer such as a semiconductor wafer. In the coating treatment, a resist film is formed by applying a resist solution and performing heat treatment on the applied resist solution. In the exposure treatment, the formed resist film is exposed to light into a predetermined pattern. In the developing treatment, the exposed resist film is developed.

In the above-described coating treatment, a so-called spin coating method is often used which applies the resist solution from a nozzle to a center of the front surface of the rotated wafer and diffuses the resist solution to the outer periphery side of the wafer by the centrifugal force to thereby apply the resist solution on the front surface of the wafer (see, for example, Japanese Laid-open Patent Publication No. 2009-78250 and Japanese Patent Publication No. 3890026).

SUMMARY OF THE INVENTION

However, there are following problems in the case of forming the resist film by applying the resist solution to the front surface of the wafer by the coating treatment using the above-described spin coating method.

It is possible to change the film thickness of the resist film by changing control parameters of the rotation speed of the wafer, the wafer temperature, the resist solution and so on. However, with an increase in the rotation speed of the wafer or an increase in the wafer temperature, the film thickness distribution in a protruding shape in which the film thickness is larger at the central portion than at the outer peripheral portion may change to the film thickness distribution in a recessed shape in which the film thickness is larger at the outer peripheral portion than at the central portion. Accordingly, changing only the above-described control parameters may merely change the film thickness distribution within the wafer and cannot precisely control the film thickness distribution.

Moreover, recently, the supply amount of the resist solution to be applied to one wafer is required to be reduced as much as possible from a viewpoint of reduction in material and cost. For example, it is sometimes required to reduce the resist solution necessary for coating the entire surface of the wafer with a diameter of 300 mmφ to 0.5 ml or less. In the case where the supply amount of the resist solution is small as described above, the solvent is more likely to evaporate to increase the viscosity than the case where the supply amount is large, and therefore it is impossible to change the course to increase the rotation speed of the wafer or increase the wafer temperature. Accordingly, it becomes difficult to control the film thickness distribution in a protruding shape in which the film thickness is larger at the central portion than at the outer peripheral portion such that the film thickness is uniform at the central portion and the outer peripheral portion.

As discussed in Japanese Patent Publication No. 3890026, there is a method of making the film thickness distribution on the substrate uniform by providing an airflow adjustment member along the periphery of the substrate having a rectangular shape. However, providing only the airflow adjustment member along the periphery of the substrate is not enough to make the film thickness distribution uniform within the substrates in various shapes including the circular shape.

Further, the above-described problems are common to the case of applying the various kinds of coating solutions other than the resist solution onto the front surface of the wafer by the spin coating method.

The present invention has been made in consideration of the above points, and an object thereof is to provide a coating treatment apparatus and a coating treatment method each capable of controlling the film thickness at an arbitrary position within the substrate and reduce the variation in film thickness within the substrate when applying a coating solution by a spin coating method to form a film.

According to an embodiment of the present invention, a coating treatment apparatus supplying a coating solution to a front surface of a rotated substrate and diffusing the supplied coating solution to an outer periphery side of the substrate to thereby apply the coating solution on the front surface of the substrate, the apparatus includes: a substrate holding part holding a substrate; a rotation part rotating the substrate held on the substrate holding part; a supply part supplying a coating solution to a front surface of the substrate held on the substrate holding part; and an airflow control plate provided at a predetermined position above the substrate held on the substrate holding part for locally changing an airflow above the substrate rotated by the rotation part at an arbitrary position.

Further, according to another embodiment of the present invention, a coating and developing treatment system includes: a coating apparatus forming a coating film including a resist film on a substrate that is a coating treatment apparatus supplying a coating solution to a front surface of a rotated substrate and diffusing the supplied coating solution to an outer periphery side of the substrate to thereby apply the coating solution on the front surface of the substrate; and a developing apparatus developing the coating film formed by the coating treatment apparatus after the coating film is exposed to light, wherein the coating treatment apparatus includes: a substrate holding part holding a substrate; a rotation part rotating the substrate held on the substrate holding part; a supply part supplying a coating solution to a front surface of the substrate held on the substrate holding part; and an airflow control plate provided at a predetermined position above the substrate held on the substrate holding part for locally changing an airflow above the substrate rotated by the rotation part at an arbitrary position.

Further, according to another embodiment of the present invention, a coating treatment method of supplying a coating solution to a front surface of a rotated substrate and diffusing the supplied coating solution to an outer periphery side of the substrate to thereby apply the coating solution on the front surface of the substrate, the method includes: locally changing an airflow above the rotated substrate by an airflow control plate provided at a predetermined position above the substrate with the substrate being rotated while supplying the coating solution to the substrate or after supplying the coating solution to the substrate.

Further, according to another embodiment of the present invention, a coating treatment method of supplying a coating solution to a front surface of a rotated substrate and diffusing the supplied coating solution to an outer periphery side of the substrate to thereby apply the coating solution on the front surface of the substrate, the method includes: a first step of supplying the coating solution to the front surface of the substrate with the substrate being rotated at a first rotation speed; a second step of stopping, after the first step, the supply of the coating solution at a point in time when the substrate is decelerated to a second rotation speed lower than the first rotation speed or with the substrate being rotated at the second rotation speed; and a third step of rotating, after the second step, the substrate at a third rotation speed higher than the second rotation speed, wherein an airflow above the rotated substrate is locally changed by moving an airflow control plate provided to be movable to a predetermined position above the substrate, to the predetermined position by a drive part after stop of the supply of the coating solution to the front surface of the substrate.

Further, according to another embodiment of the present invention, in a non-transitory computer-readable recording medium having a program recorded thereon for causing a computer to execute a coating treatment method of supplying a coating solution to a front surface of a rotated substrate and diffusing the supplied coating solution to an outer periphery side of the substrate to thereby apply the coating solution on the front surface of the substrate, the coating treatment method locally changes an airflow above the rotated substrate by an airflow control plate provided at a predetermined position above the substrate with the substrate being rotated while supplying the coating solution to the substrate or after supplying the coating solution to the substrate.

Further, according to another embodiment of the present invention, in a non-transitory computer-readable recording medium having a program recorded thereon for causing a computer to execute a coating treatment method of supplying a coating solution to a front surface of a rotated substrate and diffusing the supplied coating solution to an outer periphery side of the substrate to thereby apply the coating solution on the front surface of the substrate, the coating treatment method includes: a first step of supplying the coating solution to the front surface of the substrate with the substrate being rotated at a first rotation speed; a second step of stopping, after the first step, the supply of the coating solution at a point in time when the substrate is decelerated to a second rotation speed lower than the first rotation speed or with the substrate being rotated at the second rotation speed; and a third step of rotating, after the second step, the substrate at a third rotation speed higher than the second rotation speed, wherein an airflow above the rotated substrate is locally changed by moving an airflow control plate provided to be movable to a predetermined position above the substrate, to the predetermined position by a drive part after stop of the supply of the coating solution to the front surface of the substrate.

According to the present invention, it is possible to control the film thickness at an arbitrary position within a substrate and reduce the variation in film thickness within the substrate when applying a coating solution by a spin coating method to form a film.

BRIEF DESCRIPTION OF THE DRAWINGS

FIG. 7 is a graph showing the rotation speed of a wafer in each step of a resist coating treatment process according to the first embodiment;

DETAILED DESCRIPTION OF THE INVENTION

First Embodiment

To begin with, a coating and developing treatment system according to a first embodiment of the present invention and a coating treatment method performed in the coating and developing treatment system will be described. The coating and developing treatment system includes a coating module (a coating treatment apparatus) according to the embodiment of the present invention.

First, a resist pattern forming apparatus in which an exposure apparatus is connected to the coating and developing treatment system according to the embodiment of the present invention will be described referring to FIG. 1 to FIG. 4.

Figure 1:
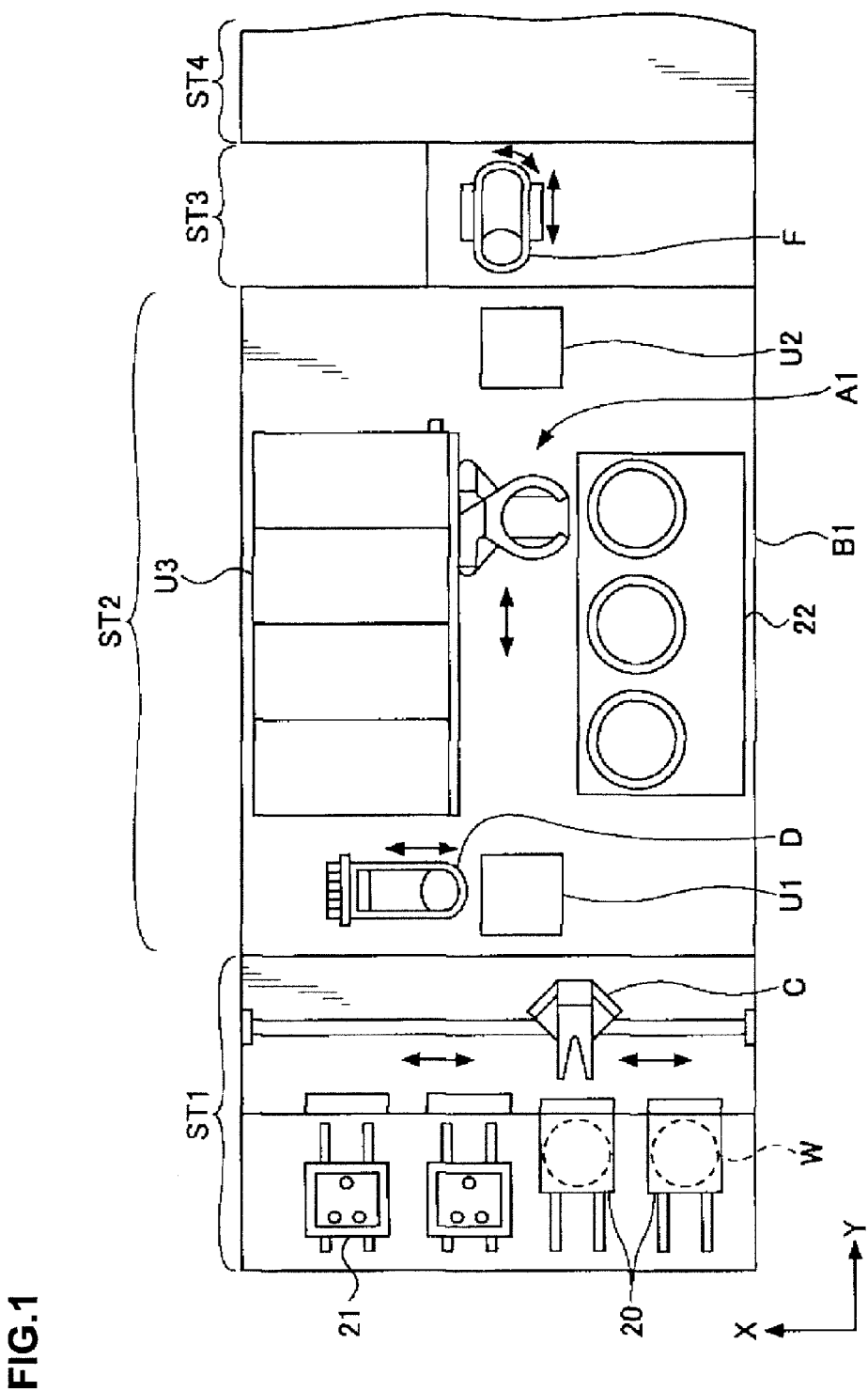
FIG. 1 is a plan view illustrating the configuration of a resist pattern forming apparatus according to a first embodiment.
Figure 2:
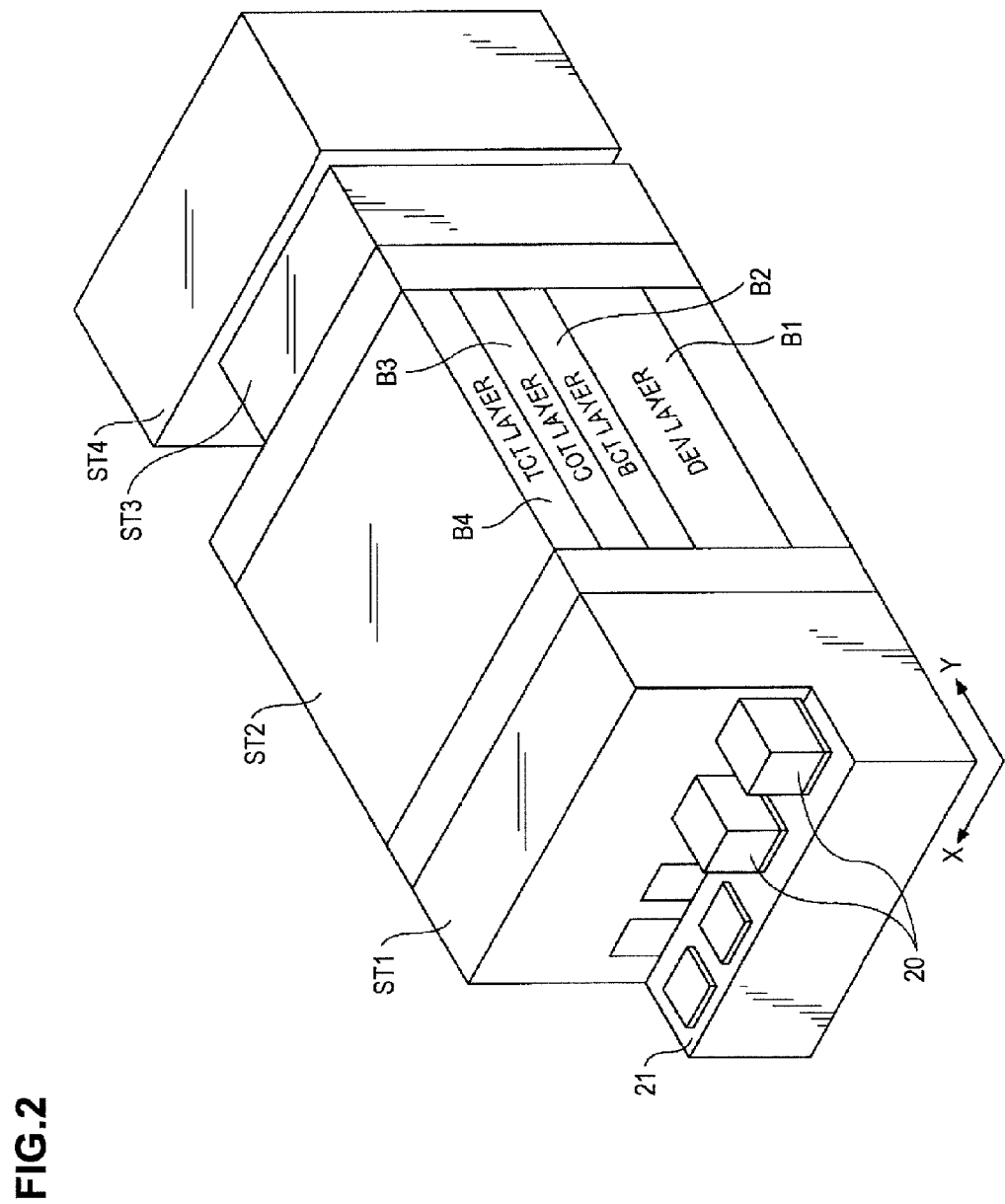
FIG. 2 is a schematic perspective view illustrating the configuration of the resist pattern forming apparatus according to the first embodiment.
Figure 3:
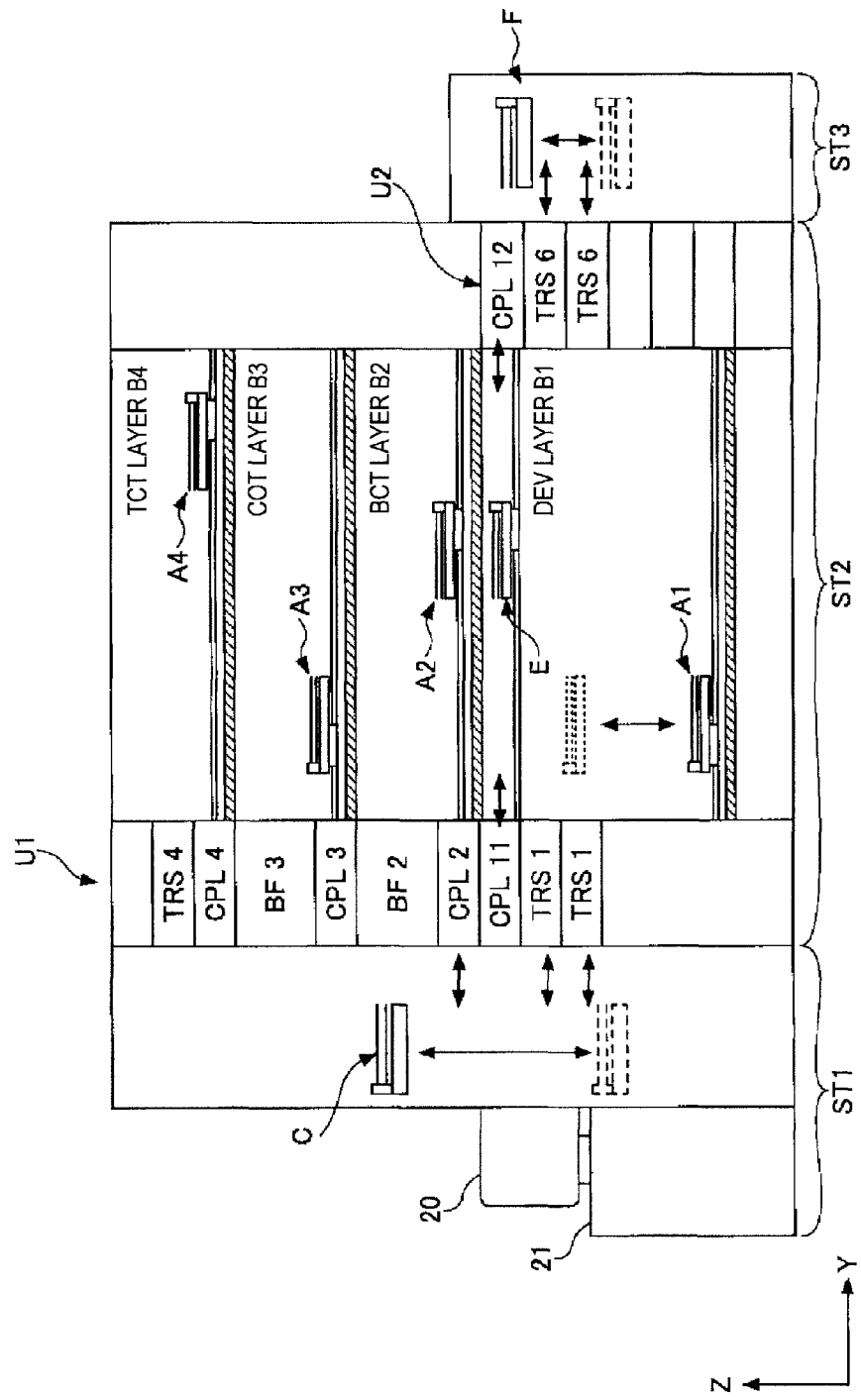
FIG. 3 is a side view illustrating the configuration of the resist pattern forming apparatus according to the first embodiment.
Figure 4:
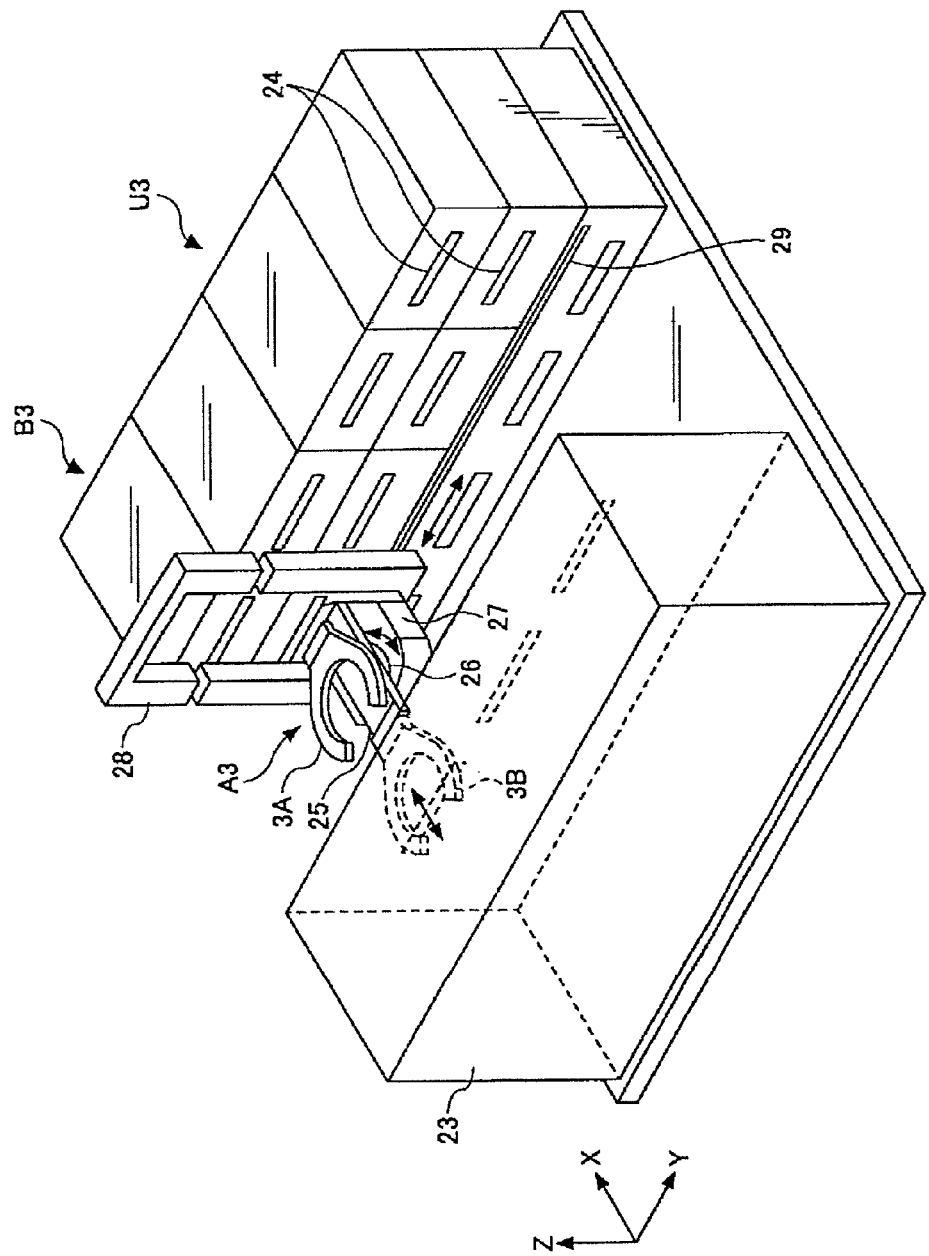
FIG. 4 is a perspective view illustrating the configuration of a third block.

FIG. 1 is a plan view illustrating the configuration of the resist pattern forming apparatus according to this embodiment. FIG. 2 is a schematic perspective view illustrating the configuration of the resist pattern forming apparatus according to this embodiment. FIG. 3 is a side view illustrating the configuration of the resist pattern forming apparatus according to this embodiment. FIG. 4 is a perspective view illustrating the configuration of a third block B3.

The resist pattern forming apparatus has, as illustrated in FIG. 1 and FIG. 2, a carrier block ST1, a treatment block ST2, and an interface block ST3. Further, an exposure apparatus ST4 is provided on the interface block ST3 side of the resist pattern forming apparatus. The treatment block ST2 is provided to adjacent to the carrier block ST1. The interface block ST3 is provided adjacent to the treatment block ST2 on the side of the treatment block ST2 opposite the carrier block ST1 side. The exposure apparatus ST4 is provided adjacent to the interface block ST3 on the side of the interface block ST3 opposite the treatment block ST2 side.

The carrier block ST1 has carriers 20, mounting tables 21, and a delivery means C. The carrier 20 is mounted on the mounting table 21. The delivery means C is for taking a wafer W out of the carrier 20 and delivering the wafer W to the treatment block ST2, receiving a treated wafer W treated in the treatment block ST2, and returning the wafer W to the carrier 20.

The treatment block ST2 has, as illustrated in FIG. 1 and FIG. 2, a shelf unit U1, a shelf unit U2, a first block (DEV layer) B1, a second block (BCT layer) B2, a third block (COT layer) B3, and a fourth block (TCT layer) B4. In the first block B1, a developing treatment is performed. In the second block B2, an anti-reflection film is formed on the lower layer side of a resist film. In the third block B3, a resist solution is applied onto the anti-reflection film. In the fourth block B4, an anti-reflection film is formed on the resist film.

The shelf unit U1 is composed of stacked various modules. The shelf unit U1 has delivery modules TRS1, TRS1, CPL11, CPL2, BF2, CPL3, BF3, CPL4, TRS4 which are, for example, stacked in order from the bottom as illustrated in FIG. 3. Further, as illustrate in FIG. 1, a delivery arm D freely rising and lowering is provided near the shelf unit U1. Between the treatment modules in the shelf unit U1, the wafer W is transferred by the delivery arm D.

The shelf unit U2 is composed of stacked various treatment modules. The shelf unit U2 has, for example, delivery modules TRS6, TRS6, CPL12 stacked in order from the bottom as illustrated in FIG. 3.

Note that, in FIG. 3, the delivery modules given CPL also serve as cooling modules for temperature regulation, and the delivery modules given BF also serve as buffer modules each capable of mounting a plurality of wafers W therein.

The first block B1 has developing modules 22, a transfer arm A1, and a shuttle arm E as illustrated in FIG. 1 and FIG. 3. The developing modules 22 are stacked one above the other at two tiers in one first block B1. The transfer arm A1 is for transferring the wafer W to the developing modules 22 at the two tiers. In short, the transfer arm A1 is in common use as transfer arms for transferring the wafers W to the developing modules 22 at the two tiers. The shuttle arm E is for directly transferring the wafer W from the delivery module CPL11 in the shelf unit U1 to the delivery module CPL12 in the shelf unit U2.

The second block B2, the third block B3, and the fourth block B4 have coating modules, treatment module groups of a heating and cooling system, and transfer arms A2, A3, A4. The treatment module groups are for performing pre-treatment and post-treatment for the treatment performed in the coating modules. The transfer arms A2, A3, A4 are provided between the coating modules and the treatment module groups and transfer the wafer W between the coating modules and treatment modules in the treatment module groups.

The blocks of the second block B2 to the fourth block B4 have the same configuration except that the chemical in the second block B2 and the fourth block B4 is a chemical for an anti-reflection film whereas the chemical in the third block B3 is a resist solution.

The configuration of the third block B3 will be described here as a representative of the second block B2, the third block B3, and the fourth block B4 referring to FIG. 4.

The third block B3 has a coating module 23 (coating treatment apparatus), a shelf unit U3, and the transfer arm A3. The shelf unit U3 has a plurality of treatment modules stacked to constitute a thermal treatment module group, such as heating modules, cooling modules and so on. The shelf unit U3 is arranged to face the coating module 23.

The transfer arm A3 is provided between the coating module 23 and the shelf unit U3. A numeral 24 in FIG. 4 denotes a transfer port for delivering the wafer W between each of the treatment modules and the transfer arm A3.

The transfer arm A3 has two forks 3 (3A, 3B), a base 25, a rotation mechanism 26, and a raising and lowering table 27.

The two forks 3A, 3B are provided to superposed one above the other. The base 25 is provided to be rotatable around the vertical axis by means of the rotation mechanism 26. Further, the forks 3A, 3B are provided to freely move back and forth from the base 25, for example, with respect to a later-described spin chuck 31 of the coating module 23 by means of a not-illustrated forward/backward mechanism.

The raising and lowering table 27 is provided on the lower side of the rotation mechanism 26 as illustrated in FIG. 4. The raising and lowering table 27 is provided to freely rise and lower, by means of a raising and lowering mechanism, along a not-illustrated Z-axis guide rail linearly extending in the top-bottom direction (Z-axis direction in FIG. 4). As the raising and lowering mechanism, a well-known structure such as a ball screw mechanism or a mechanism using a timing belt can be used. In this embodiment, the Z-axis guide rail and the raising and lowering mechanism are separately covered with a cover body 28 and connected, for example, on the upper side into one unit. Further, the cover body 28 is configured to move and slide along a Y-axis guide rail 29 linearly extending in a Y-axis direction.

The interface block ST3 has an interface arm F as illustrated in FIG. 1. The interface arm F is provided near the shelf unit U2 in the treatment block ST2. Between the treatment modules in the shelf unit U2 and between the treatment modules and the exposure apparatus ST4, the wafer W is transferred by the interface arm F.

The wafers W from the carrier block ST1 are successively transferred by the delivery means C into one delivery module in the shelf unit U1, for example, the delivery module CPL2 corresponding to the second block B2. The wafer W transferred to the delivery module CPL2 is delivered to the transfer arm A2 in the second block B2 and transferred via the transfer arm A2 to each of the treatment modules (the coating module and each of the treatment modules in the treatment module group of the heating and cooling system), and subjected to treatment in each treatment module. Thus, an anti-reflection film is formed on the wafer W.

The wafer W on which the anti-reflection film is formed is delivered to the transfer arm A3 in the third block B3 via the transfer arm A2, the delivery module BF2 in the shelf unit U1, the delivery arm D, and the delivery module CPL3 in the shelf unit U1. The wafer W is then transferred to each of the treatment modules (the coating module and each of the treatment modules in the treatment module group of the heating and cooling system) via the transfer arm A3, and subjected to treatment in each treatment module. Thus, a resist film is formed on the wafer W.

The wafer W on which the resist film is formed is delivered to the delivery module BF3 in the shelf unit U1 via the transfer arm A3.

Further, the wafer W on which the resist film is formed is, in some cases, further subjected to formation of an anti-reflection film in the fourth block B4. In this case, the wafer W is delivered to the transfer arm A4 in the fourth block B4 via the delivery module CPL4, transferred to each of the treatment modules (the coating module and each of the treatment modules in the treatment module group of the heating and cooling system) via the transfer arm A4, and subjected to treatment in each treatment module. Thus, an anti-reflection film is formed on the wafer W. The wafer W on which the anti-reflection film is formed is then delivered to the delivery module TRS4 in the shelf unit U1 via the transfer arm A4.

The wafer W on which the resist film is formed or the wafer W on which the anti-reflection film is further formed on the resist film thereon is delivered to the delivery module CPL11 via the delivery arm D and the delivery module BF3 or TRS4. The wafer W delivered to the delivery module CPL11 is directly transferred by the shuttle arm E to the delivery module CPL12 in the shelf unit U2, and then delivered to the interface arm F in the interface block ST3.

The wafer W delivered to the interface arm F is transferred to the exposure apparatus ST4 and subjected to a predetermined exposure treatment. The wafer W subjected to the predetermined exposure treatment is mounted on the delivery module TRS6 in the shelf unit U2 via the interface arm F, and returned to the treatment block ST2. The wafer W returned to the treatment block ST2 is subjected to a developing treatment in the first block B1. The wafer W subjected to the developing treatment is returned to the carrier 20 via the transfer arm A1, any one of the delivery modules TRS1 in the shelf unit U1, and the delivery means C.

Figure 5:
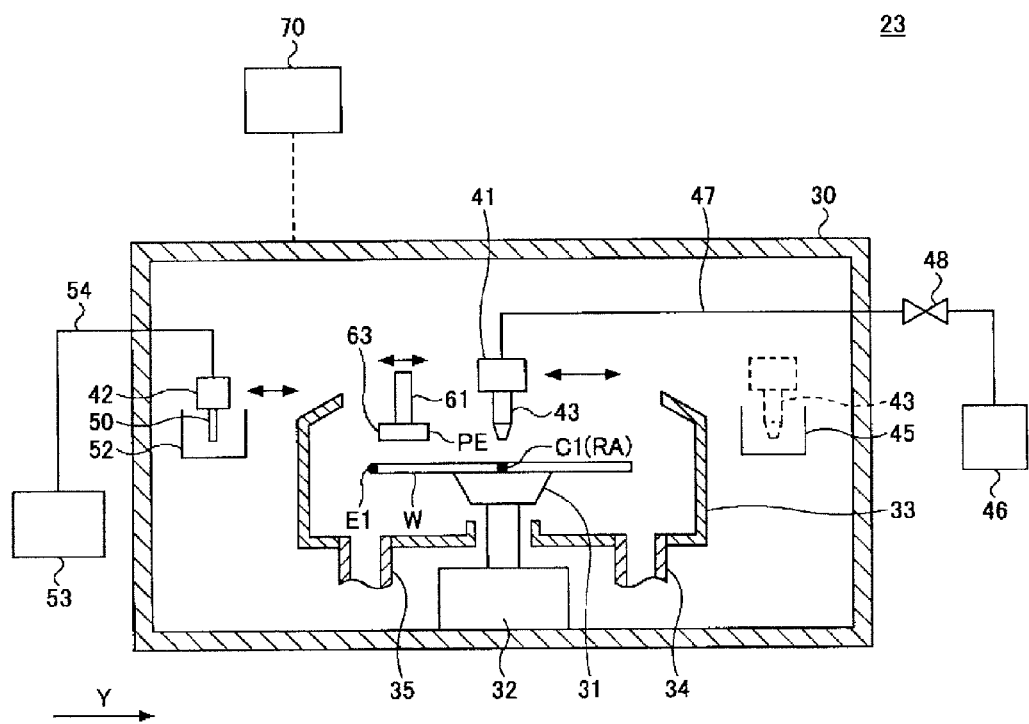
FIG. 5 is a longitudinal sectional view illustrating a schematic configuration of a coating module.
Figure 6:
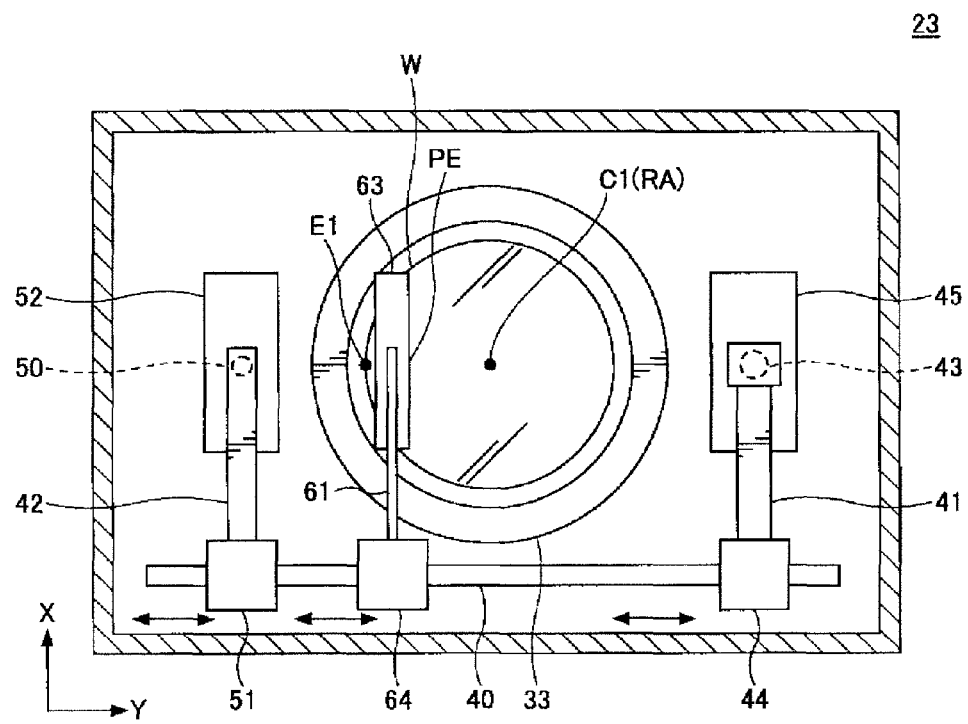
FIG. 6 is a transverse sectional view illustrating the schematic configuration of the coating module.

Next, the configuration of the coating module 23 according to this embodiment will be described referring to FIG. 5 and FIG. 6. FIG. 5 is a longitudinal sectional view illustrating a schematic configuration of the coating module 23. FIG. 6 is a transverse sectional view illustrating the schematic configuration of the coating module 23.

The coating module 23 has, for example, a casing 30 as illustrated in FIG. 5, and a spin chuck 31 (substrate holding part) holding the wafer W thereon is provided at the central portion in the casing 30. The spin chuck 31 has a horizontal upper surface, and the upper surface is provided with, for example, a suction port (not illustrated) for sucking the wafer W. By suction through the suction port, the wafer W can be suction-held on the spin chuck 31.

The spin chuck 31 has a chuck drive mechanism 32 equipped with, for example, a motor or the like and can be rotated at a predetermined speed by the chuck drive mechanism 32 (rotation part). Further, the chuck drive mechanism 32 is provided with a raising and lowering drive source such as a cylinder so that the spin chuck 31 is movable up and down.

Further, the rotation speed of the spin chuck 31 driven by the chuck drive mechanism 32 is controlled by a later-described control unit 70.

Around the spin chuck 31, a cup 33 is provided which receives and collects liquid splashing or dropping from the wafer W. A drain pipe 34 for draining the collected liquid and an exhaust pipe 35 for exhausting the atmosphere in the cup 33 are connected to the bottom surface of the cup 33.

As illustrated in FIG. 6, on an X-direction negative direction (lower direction in FIG. 6) side of the cup 33, a rail 40 is formed which extends along a Y-direction (right-left direction in FIG. 6). The rail 40 is formed, for example, from a Y-direction negative direction (left direction in FIG. 6) side outer position of the of the cup 33 to a Y-direction positive direction (right direction in FIG. 6) side outer position. On the rail 40, for example, two arms 41, 42 are attached.

On the first arm 41, a resist solution nozzle 43 (supply part) discharging the resist solution as a coating solution is supported as illustrated in FIG. 5 and FIG. 6. The first arm 41 is movable on the rail 40 by means of a nozzle drive part 44 illustrated in FIG. 6. Thus, the resist solution nozzle 43 can move from a waiting section 45 provided at a Y-direction positive direction side outer position of the cup 33 to a position above almost the center of the wafer W in the cup 33 and can move in a radial direction of the wafer W above the front surface of the wafer W. Further, the first arm 41 can freely rise and lower by means of the nozzle drive part 44 to be able to adjust the height of the resist solution nozzle 43.

To the resist solution nozzle 43, a supply pipe 47 communicating with a resist solution supply source 46 is connected as illustrated in FIG. 5. Inside the resist solution supply source 46 in this embodiment, a low-viscosity resist solution for forming a resist film, for example, a thin resist film of, for example, 150 nm or less is stored. Along the supply pipe 47, a valve 48 is further provided so that when the valve 48 is opened, the resist solution is discharged from the resist solution nozzle 43, and when the valve 48 is closed, the discharge of the resist solution is stopped.

On the second arm 42, a solvent nozzle 50 discharging a solvent for the resist solution is supported. The second arm 42 is movable on the rail 40, for example, by means of a nozzle drive part 51 illustrated in FIG. 6, and can move the solvent nozzle 50 from a waiting section 52 provided at a Y-direction negative direction side outer position of the cup 33 to a position above almost the center of the wafer W in the cup 33. Further, the second arm 42 can freely rise and lower by means of the nozzle drive part 51 to be able to adjust the height of the solvent nozzle 50.

To the solvent nozzle 50, a supply pipe 54 communicating with a solvent supply source 53 is connected as illustrated in FIG. 5. Note that the resist solution nozzle 43 discharging the resist solution and the solvent nozzle 50 discharging the solvent are supported on separate arms in the above configuration. However, the resist solution nozzle 43 and the solvent nozzle 50 may be supported on the same arm so that movements and discharge timings of the resist solution nozzle 43 and the solvent nozzle 50 may be controlled by controlling the movement of the arm.

An airflow control plate 63 locally changing, at an arbitrary position, airflow above the wafer W is supported on a third arm 61 as illustrated in FIG. 5 and FIG. 6. The third arm 61 is movable on the rail 40 by means of a drive part 64 illustrated in FIG. 6. The drive part 64 can move the airflow control plate 63 between a predetermined position above the wafer W in the cup 33 and a waiting position distant in a lateral direction from the wafer W held on the spin chuck 31 in the cup 33. The third arm 61 can move to an arbitrary position in a range from a Y-direction negative direction side outer position of the cup 33 to a position above almost the center of the wafer W in the cup 33 and can move in a radial direction of the wafer W above the front surface of the wafer W. Further, the third arm 61 can freely rise and lower by means of the drive part 64 to be able to adjust the height of the airflow control plate 63.

The airflow control plate 63 is formed in a rectangular flat plate shape and provided to be movable to a predetermined position above the wafer W and distant from a rotation axis RA (the same position as a center C1) of the wafer W to be substantially parallel to the wafer W. The airflow control plate 63 is for locally changing, at an arbitrary position, the airflow above the rotated wafer W when it is placed by the drive part 64 at the predetermined position above the wafer W and distant from the rotation axis RA (the same position as the center C1) of the wafer W. Note that a wafer center side end portion PE of the airflow control plate 63 formed in a rectangular flat plate shape may be positioned between a position above the center C1 and a position above an outer edge E1 of the wafer W. When the wafer W has, for example, a diameter of 300 mm, the airflow control plate 63 is preferably placed in an arbitrary range above a range of 50 mm to 100 mm from the center of the wafer W. When the wafer W has, for example, a diameter of 450 mm, the airflow control plate 63 is preferably placed in an arbitrary range above a range of 100 mm to 175 mm from the center of the wafer W. Further, the airflow control plate 63 is preferably placed in an arbitrary range above a range of about 30% to 80% of the radius of the wafer W from the center of the wafer W toward the outer periphery of the wafer W.

The rotation operation of the spin chuck 31 by the chuck drive mechanism 32 is controlled by the control unit 70. Further, the moving operation of the resist solution nozzle 43 by the nozzle drive part 44, the discharge/stop of the resist solution from the resist solution nozzle 43 by the valve 48 are also controlled by the control unit 70. Further, the operations of the driving system such as the moving operation of the solvent nozzle 50 by the nozzle drive part 51 and the moving operation of the airflow control plate 63 by the drive part 64 are also controlled by the control unit 70. The control unit 70 is composed of a computer including, for example, a CPU, a memory and so on and can realize a resist coating treatment process in the coating module 23 by executing a program stored, for example, in a memory.

The control unit 70 conducts control to supply the resist solution by the resist solution nozzle 43 to the front surface of the wafer W. The control unit 70 further conducts control to locally change the airflow above the rotated wafer W by the airflow control plate 63 provided at a predetermined position with the wafer W being rotated by the chuck drive mechanism 32 while the resist solution is being supplied to the wafer W or after the resist solution is supplied to the wafer W.

Note that various programs to realize the resist coating treatment process in the coating module 23 are recorded, for example, on a recording medium such as a computer-readable CD, installed from the recording medium into the control unit 70, and executed by the control unit 70.

Figure 8A:
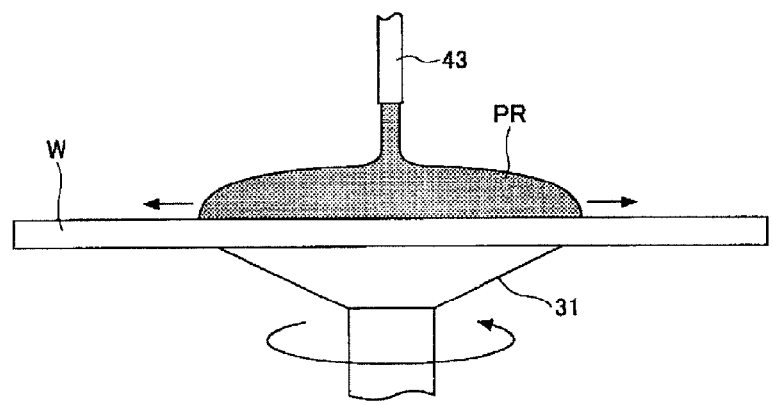
FIG. 8A is a view illustrating the state of a front surface of the wafer when a first step S1 according to the first embodiment is performed.

Next, the resist coating treatment process (coating treatment method) performed in the coating module 23 will be described FIG. 7 is a graph showing the rotation speed of the wafer in each step of the resist coating treatment process according to this embodiment. FIG. 8A and FIG. 8D are views illustrating the states of the front surface of the wafer W in the steps of the resist coating treatment process according to this embodiment.

In this embodiment, the control unit 70 controls the rotation speed of the wafer W (namely, the rotation speed of the chuck drive mechanism 32), the discharge of the solvent from the solvent nozzle 50, and the discharge of the resist solution from the resist solution nozzle 43 to perform steps S0 to S2 and S4 and S5 illustrated in FIG. 7. Further, FIG. 8A to FIG. 8D schematically illustrate a resist solution PR on the wafer W at steps S1, S2, S4 and S5 illustrated in FIG. 7 respectively.

First, the wafer W is transferred to a position directly above the spin chuck 31 of the coating module 23 by the fork 3 of the transfer arm A3. The wafer W is then vacuum-sucked on the spin chuck 31 which is raised by a not-illustrated raising and lowering drive means composed, for example, of an air cylinder included in the chuck drive mechanism 32. After the wafer W is vacuum-sucked on the spin chuck 31, the transfer arm A3 retracts the fork 3 from the inside of the coating module 23, thereby finishing the delivery of the wafer W to the coating module 23.

Next, a pre-wet treatment step S0 illustrated in FIG. 7 is performed. In the pre-wet treatment step S0, the entire front surface of the wafer W is wetted with the solvent such as a thinner or the like prior to application of the resist solution PR. Concretely, after start of rotation of the wafer W, the number of rotations is increased, for example, to 0 to 2000 rpm, more preferably, to 1000 rpm as illustrated in FIG. 7. While the wafer W is being rotated at this rotation speed (a pre-wet rotation speed V0), the thinner is supplied to almost the center of the wafer W from the solvent nozzle 50, for example, for 0.1 seconds and diffused to the outer periphery side in the radial direction of the wafer W, whereby the front surface of the wafer W is wetted with the solvent. This makes the resist solution PR easily diffuse, with the result that a uniform resist film can be formed with a smaller amount of resist solution PR and the consumption of the resist solution PR can be further reduced.

Subsequently, a first step S1 in FIG. 7 is performed. The first step S1 is a step of rotating the substrate (wafer W) at a first rotation speed V1, supplying the resist solution PR onto almost the center of the rotated wafer W, and diffusing the supplied resist solution PR from the center side to the outer periphery side of the wafer W. Concretely, the wafer W is accelerated to a rotation speed (first rotation speed V1) of 2000 to 4000 rpm, more preferably, 2500 rpm and rotated at the rotation speed V1 as illustrated at S1 in FIG. 7. Then, while the wafer W is being rotated, the resist solution is supplied from the resist solution nozzle 43 onto almost the center of the wafer W, for example, for 1.5 seconds and thereby applied while being diffused to the outer periphery side in the radial direction of the wafer W. FIG. 8A is a side view illustrating the state of the wafer W when the first step S1 is performed.

The supply amount of the resist solution PR supplied at the first step S1 is about half of the supply amount in the case where the outer periphery of the resist solution PR diffused to the outer periphery side in the radial direction of the wafer W reaches the outer periphery of the wafer W at the above-described rotation speed. Concretely, the amount of the resist solution to be supplied to the center side of the front surface of the wafer W at the first step S1 is, for example, 0.5 ml that is half of 1.0 ml that is conventionally supplied. Therefore, at the first step S1, the outer periphery of the resist solution PR diffused from the center side to the outer periphery side in the radial direction of the wafer W does not reach the outer periphery of the wafer W but reaches, for example, about half of the distance from the center to the outer periphery of the wafer W as illustrated in FIG. 8A.

Next, a second step S2 in FIG. 7 is performed. The second step S2 is a step of rotating, after the first step S1, the wafer W at a second rotation speed V2 lower than the first rotation speed V1 to fix up the shape of the diffused resist solution PR. Concretely, as illustrated in FIG. 7, the wafer W is decelerated to a rotation speed (second rotation speed V2) of 50 to 2000 rpm, more preferably, 100 rpm and rotated at the rotation speed V2. A time period for performing the second step S2 is preferably, for example, about 1.0 second. Further, FIG. 8B is a side view illustrating the state of the wafer W when the second step S2 is performed.

Note that at the second step S2, the supply of the resist solution PR is stopped at the point in time when the wafer W is decelerated from the first rotation speed V1 to the second rotation speed V2 or with the wafer W being rotated at the second rotation speed V2.

Figure 8B:
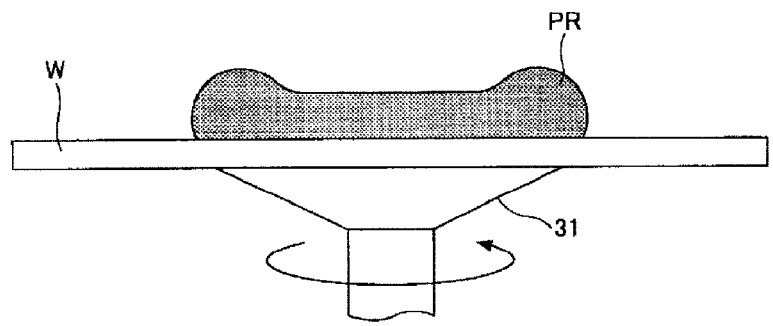
FIG. 8B is a view illustrating the state of the front surface of the wafer when a second step S2 according to the first embodiment is performed.

As illustrated in FIG. 8B, the outer periphery of the resist solution which does not reach the outer periphery of the wafer W but reaches, for example, about only half of the distance from the center to the outer periphery of the wafer W at the first step S1 is located at substantially the same position as that at the first step S1 also at the second step S2. Further, the resist solution PR accumulates at the outer periphery and increases in thickness at the outer periphery of the diffused resist solution PR, whereby the shape of the resist solution PR is fixed up as will be described later.

Next, a third step in FIG. 7 is performed. The third step S3 is a step of rotating, after the second step S2, the wafer W at a third rotation speed V3 higher than the second rotation speed V2 at least at start time. The third step S3 includes, for example, a fourth step S4, a fifth step S5, and a sixth step S6.

The fourth step S4 is a step of rotating, after the second step S2, the wafer W at the third rotation speed V3 higher than the second rotation speed V2 to further diffuse the fixed up resist solution PR to the outer periphery side in the radial direction of the wafer W. Concretely, as illustrated at S4 in FIG. 7, the wafer W is accelerated to a rotation speed (third rotation speed V3) of 1000 to 4000 rpm, more preferably, 1800 rpm and rotated at the rotation speed V3. Then, while the wafer W is being rotated, the resist solution diffused to about half of the distance from the center to the outer periphery in the radial direction of the wafer W at the first step S1 is further diffused to the outer periphery side. A time period for performing the fourth step S4 is preferably, for example, about 4 seconds. Further, FIG. 8C is a side view illustrating the state of the wafer W when the fourth step S4 is performed.

Figure 8C:
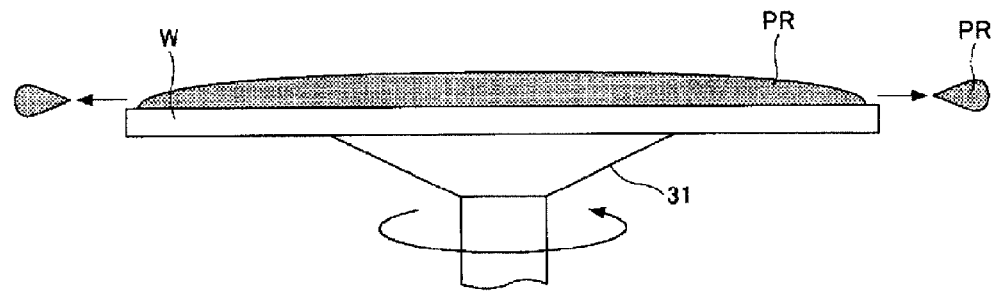
FIG. 8C is a view illustrating the state of the front surface of the wafer when a fourth step S4 according to the first embodiment is performed.
Figure 8D:
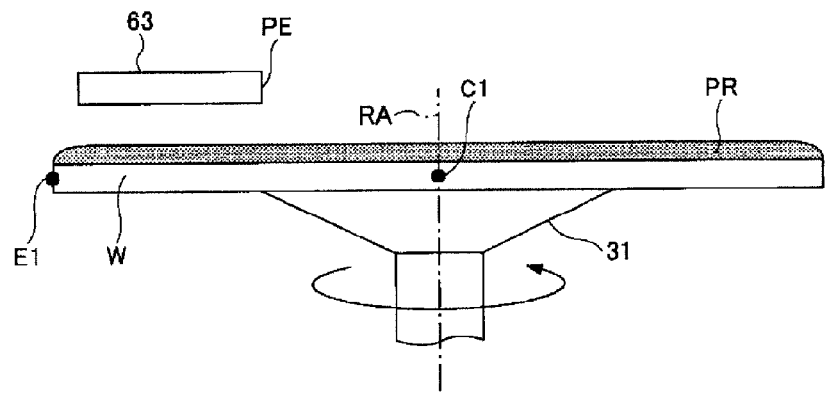
FIG. 8D is a view illustrating the state of a front surface of the wafer when a fifth step S5 according to the first embodiment is performed.

As illustrated in FIG. 8C, at the fourth step S4, the outer periphery of the resist solution diffused to the outer periphery side in the radial of the wafer W reaches almost the outer periphery of the wafer W. Further, a time period for performing the fourth step S4 is preferably, for example, a short time of 5 seconds or less to prevent the resist solution PR from losing the flowability at the fourth step S4.

The fifth step S5 is a step of rotating, after the fourth step S4, the wafer W at a fourth rotation speed V4 lower than the third rotation speed V3. Further, at the fifth step S5, while the wafer W is being rotated at the fourth rotation speed V4, the drive part 64 places the airflow control plate 63 at the predetermined position above the wafer W to locally change the airflow above the wafer W. The fourth rotation speed V4 may be made equal to the second rotation speed V2. Concretely, the wafer W is decelerated to the rotation speed of 50 to 2000 rpm, for example, 100 rpm and rotated at the rotation speed as illustrated in FIG. 7. A time period for performing the fifth step S5 is preferably, for example, about 0.1 seconds. Further, FIG. 8D is a side view illustrating the state of the wafer W when the fifth step S5 is performed.

Note that the fourth rotation speed V4 is preferably 50 to 100 rpm. This makes it possible to make a large difference in evaporation rate of the solvent between the surrounding area of the wafer center side end portion PE of the later-described airflow control plate 63 and the other area.

As illustrated in FIG. 8D, the drive part 64 (FIG. 6) moves the airflow control plate 63, whereby the airflow control plate 63 having a rectangular flat plate shape is placed to be substantially parallel to the wafer W at the predetermined position above the wafer W and distant from the rotation axis RA of the wafer W. The airflow control plate 63 locally changes the airflow above the rotated wafer W and thereby can increase the film thickness of the resist solution PR near the wafer center side end portion PE of the airflow control plate 63. Further, it is possible to adjust the position of the airflow control plate 63 such that the wafer center side end portion PE of the airflow control plate 63 is placed at an arbitrary position between the position above the center C1 and the position above the outer edge E1 of the wafer W. Therefore, the film thickness at an arbitrary position of the wafer W can be controlled and the variation in film thickness within the wafer W can be reduced.

The sixth step S6 is a step of rotating, after the fifth step S5, the wafer W at a fifth rotation speed V5 higher than the fourth rotation speed V4 to shake off and dry the resist solution PR on the wafer W. The fifth rotation speed V5 may be made equal to the third rotation speed V3. Concretely, the wafer W is accelerated to a rotation speed (equal to the third rotation speed V3) of 1000 to 4000 rpm, more specifically, 1800 rpm and the resist solution PR is shaken off and dried, for example, for 30 seconds while the wafer W is being rotated as illustrated at S5 in FIG. 7.

Next, that the film thickness at an arbitrary position of the wafer W can be controlled and the variation in film thickness within the wafer W can be reduced at the fifth step S5 will be described while compared to a comparative example.

Figure 9:
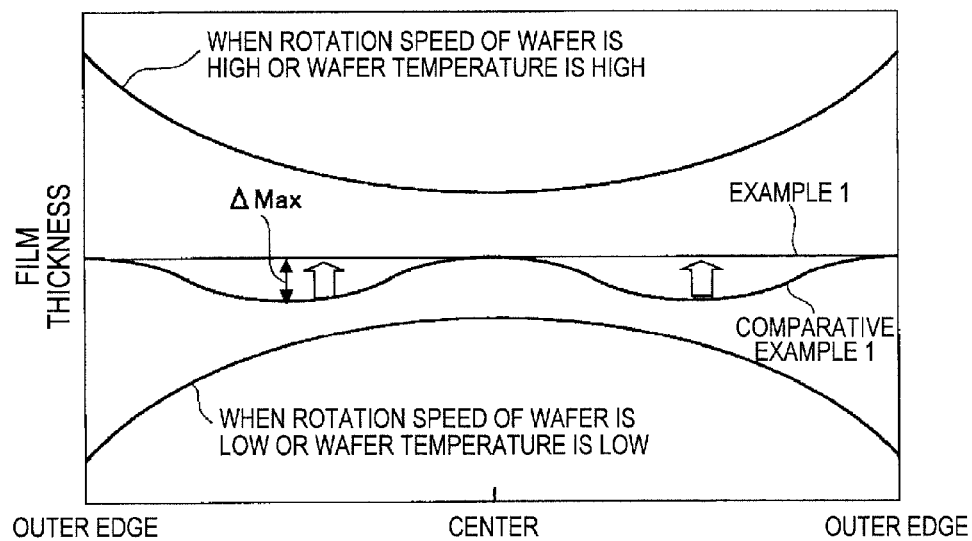
FIG. 9 is a graph schematically showing the film thickness distribution of a resist film obtained by a resist coating treatment process according to the first embodiment (Example 1) compared to the film thickness distribution of a resist film obtained by a resist coating treatment process without using an airflow control plate (Comparative Example 1)

FIG. 9 is a graph schematically showing the film thickness distribution of a resist film obtained by the resist coating treatment process according to this embodiment (Example 1) compared to the film thickness distribution of a resist film obtained by a resist coating treatment process without using the airflow control plate 63 (Comparative Example 1).

As shown in FIG. 9, when the rotation speed of the wafer is low or the wafer temperature is low, the film thickness distribution sometimes exhibits a protruding shape in which the film thickness is larger at the central portion than at the outer peripheral portion. Alternatively, when the rotation speed of the wafer is high or the wafer temperature is high, the film thickness distribution sometimes exhibits a recessed shape in which the film thickness is larger at the outer peripheral portion than at the central portion. In the case of not using the airflow control plate 63 (Comparative Example 1), the film thickness at an intermediate portion between the central portion and the outer peripheral portion of the wafer sometimes becomes smaller than the film thickness at the central portion and the outer peripheral portion of the wafer even when the rotation speed of the wafer and the wafer temperature are adjusted so that the film thickness distribution within the wafer becomes as uniform as possible.

On the other hand, when the airflow control plate 63 is placed such that the wafer center side end portion PE of the airflow control plate 63 is located at an intermediate position between the position above the center C1 and the position above the outer edge E1 of the wafer W (Example 1), the film thickness near the wafer center side end portion PE of the airflow control plate 63 can be preferentially increased. As a result of this, the film thickness can be made equal at any of the central portion, the intermediate portion and the outer peripheral portion of the wafer W, so that the film thickness within the wafer W can be made uniform.

Figure 10:
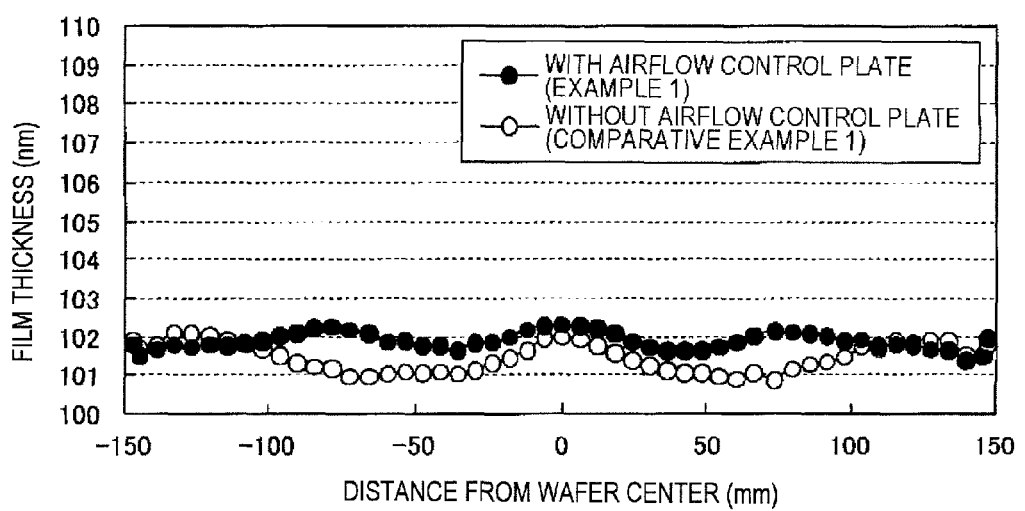
FIG. 10 is a graph showing the actual measured values of the film thickness distributions of the resist films obtained by performing Example 1 and Comparative Example 1.

FIG. 10 is a graph showing the actual measured values of the film thickness distributions of the resist films obtained by performing Example 1 and Comparative Example 1 under the condition that the wafer temperature was 23° C. and the rotation speed at the fifth step S5 was 100 rpm.

In Comparative Example 1 in FIG. 10, the film thickness is substantially equal to 102 nm at the central portion that is an area near the center of the wafer W (a distance from the wafer center Y=0 mm) and at the outer peripheral portion that is an area near the outer edge of the wafer W (Y=−150 mm, 150 mm) However, the film thickness at the intermediate portion that is an area between the center and the outer edge of the wafer W (−80 mm<Y<−40 mm, 40 mm<Y<80 mm) is close to 101 nm that is smaller in film thickness by about 1 nm as compared to that at the central portion and the outer peripheral portion. The average value of the film thickness in this event was 101.5 nm and the variation 3 σ in film thickness was 1.12 nm.

On the other hand, in Example 1 in FIG. 10, the film thickness is substantially equal to 102 nm at any of the central portion, the outer peripheral portion and the intermediate portion of the wafer W. The average value of the film thickness in this event was 101.9 nm and the variation 3 σ in film thickness was 0.66 nm.

Therefore, also in the actual measured value shown in FIG. 10, the film thickness can be made equal at any of the central portion, the intermediate portion and the outer peripheral portion of the wafer W by using the airflow control plate 63 as in FIG. 9, and it can be understood that the film thickness within the wafer W can be made uniform.

Next, that the film thickness of the resist film can be freely controlled by adjusting the dimension and the position of the airflow control plate 63 will be described.

Figure 11A:
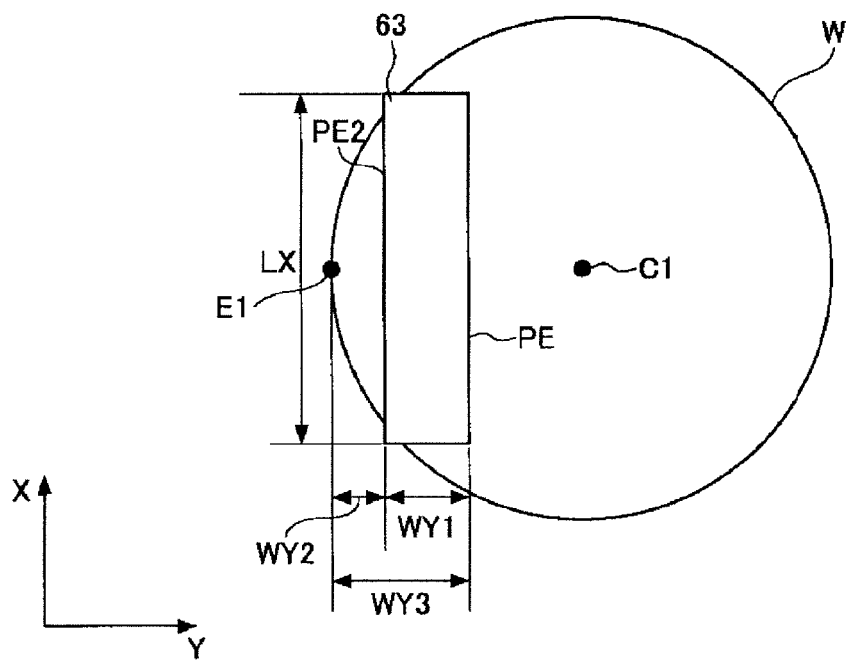
FIG. 11A is a plan view schematically illustrating the positional relation between the airflow control plate and the wafer.
Figure 11B:
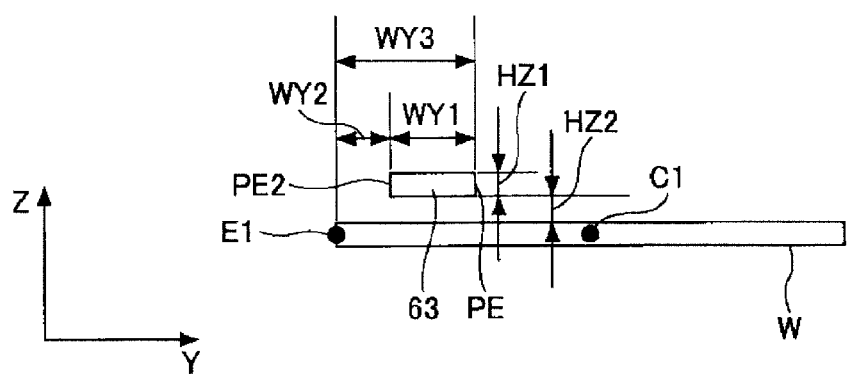
FIG. 11B is a side view schematically illustrating the positional relation between the airflow control plate and the wafer.

FIG. 11A and FIG. 11B are a plan view and a side view schematically illustrating the positional relation between the airflow control plate 63 and the wafer W respectively.

As illustrated in FIG. 11A and FIG. 11B, the length dimension in an X-direction of the airflow control plate 63 is LX. Further, the width dimension in a Y-direction of the airflow control plate 63 is WY1. Further, the distance between a wafer outer periphery side end portion PE2 along the Y-direction of the airflow control plate 63 and the outer edge E1 is WY2, and the distance between the wafer center side end portion PE along the Y-direction of the airflow control plate 63 and the outer edge E1 of the wafer W is WY3. Further, the thickness dimension in a Z-direction of the airflow control plate 63 is HZ1, and the height dimension in the Z-direction of a lower surface of the airflow control plate 63 from the front surface of the wafer W is HZ2.

Figure 12:
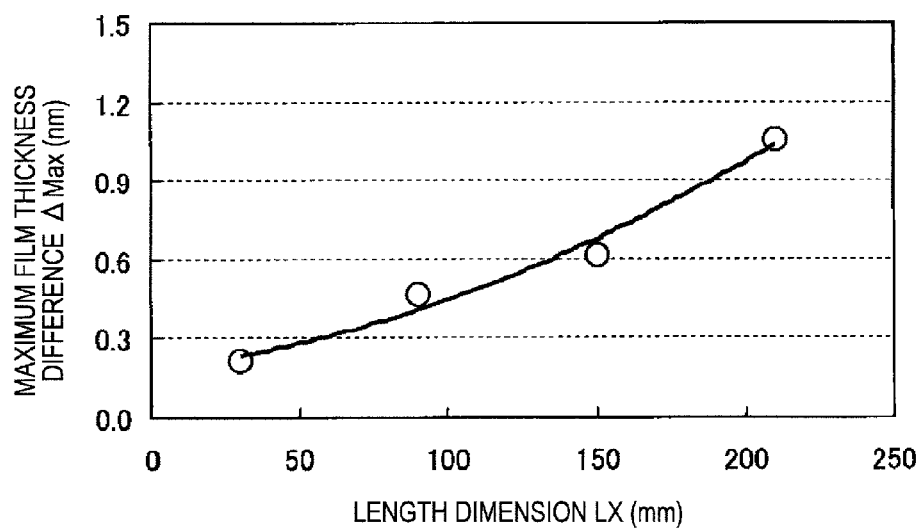
FIG. 12 is a graph showing the result of measurement of a maximum film thickness difference ΔMax when a length dimension LX in an X-direction of the airflow control plate is changed.

FIG. 12 is a graph showing the result of measurement of a maximum film thickness difference ΔMax when the length dimension LX in the X-direction of the airflow control plate 63 is changed, which is the maximum difference along the radial direction as illustrated in FIG. 9 in film thickness of the resist film between when using the airflow control plate 63 and when not using the airflow control plate 63. In this event, WY1 is set to a predetermined value of 50 mm and WY2 is set to a predetermined value of 0 mm.

As illustrated in FIG. 12, ΔMax increases with an increase in LX. More specifically, when the airflow control plate 63 increases in length in a direction perpendicular to the radial direction, the adjustment amount of the film thickness adjustable by the airflow control plate 63 increases. Thus, by adjusting the length of the airflow control plate 63 in the direction perpendicular to the radial direction, the film thickness of the resist film can be freely adjusted.

Figure 13:
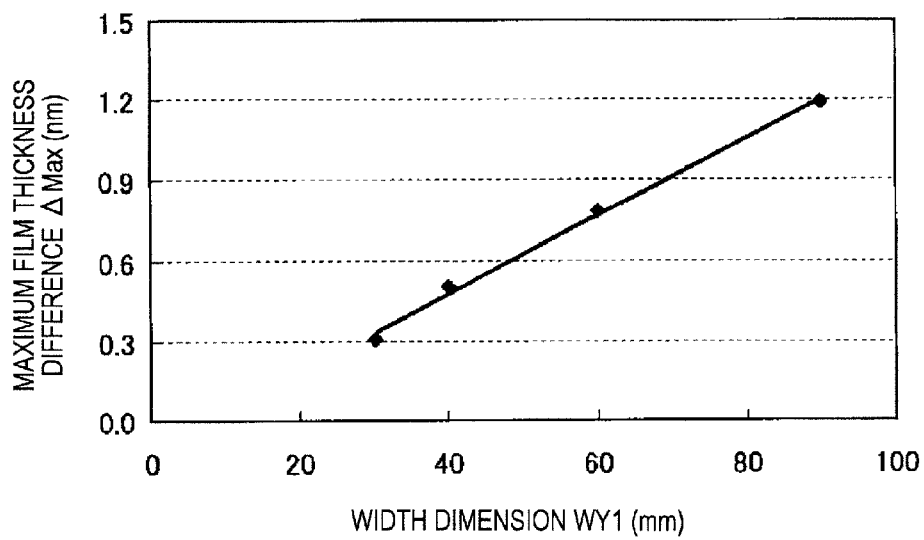
FIG. 13 is a graph showing the result of measurement of the maximum film thickness difference ΔMax when a width dimension WY1 in a Y-direction of the airflow control plate is changed.

FIG. 13 is a graph showing the result of measurement of the maximum film thickness difference ΔMax when the width dimension WY1 in the Y-direction of the airflow control plate 63 is changed, which is the maximum difference along the radial direction as illustrated in FIG. 9 in film thickness of the resist film between when using the airflow control plate 63 and when not using the airflow control plate 63. In this event, LX is set to a predetermined value of 223 mm and WY3 is set to a predetermined value of 90 mm.

As illustrated in FIG. 13, ΔMax also increases with an increase in WY1. More specifically, when the airflow control plate 63 increases in width in the radial direction, the adjustment amount of the film thickness adjustable by the airflow control plate 63 increases. Thus, by adjusting the width of the airflow control plate 63 in the radial direction, the film thickness of the resist film can be freely adjusted.

Here, the operation and effect of controlling the film thickness of the resist film by adjusting the dimension and the position of the airflow control plate 63 will be described.

Figure 14:
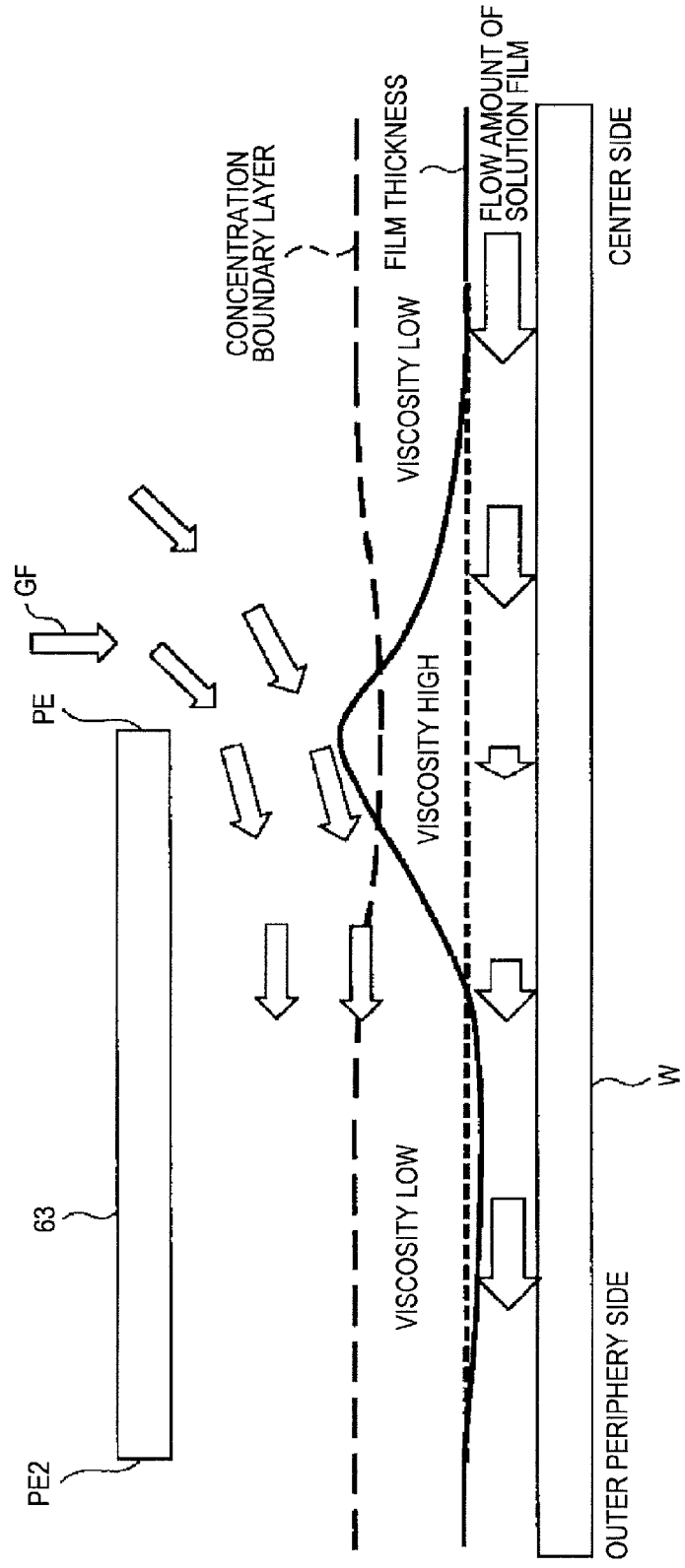
FIG. 14 is a sectional view schematically illustrating the airflow around the airflow control plate and the wafer and the film thickness distribution.

FIG. 14 is a sectional view schematically illustrating the airflow around the airflow control plate 63 and the wafer W and the film thickness distribution.

In an area above the front surface of the wafer W and where the airflow control plate 63 is placed above the wafer W, the diffusion of the solvent evaporated from the resist solution is suppressed and the evaporation rate of the solvent decreases, thereby suppressing a decrease in concentration of the solvent in the resist solution. In particular, near the wafer outer periphery side end portion PE2 of the airflow control plate 63, the concentration gradient of the solvent in the height direction (Z-direction) decreases to decrease the evaporation rate of the solvent from the resist solution. As a result, in an area covered with the airflow control plate 63 and an area on the outer periphery side thereof, the concentration of a solute (resist) in the resist solution is less likely to increase, and the viscosity of the resist solution is maintained to be relatively low.

On the other hand, in an area above the front surface of the wafer W and below the wafer center side end portion PE of the airflow control plate 63, an obliquely downward airflow GF from above the center side toward below the airflow control plate 63 is generated, so that the thickness of a concentration boundary layer where the solvent concentration is a predetermined concentration or higher is smaller than that in the area on the outer periphery side. Along with this, the concentration gradient of the solvent in the height direction (Z-direction) increases to increase the evaporation rate of the solvent. As a result, in the area below the wafer center side end portion PE of the airflow control plate 63, the concentration of the solute (resist) in the resist solution increases to increase the viscosity of the resist solution.

As a result, in the area from the wafer center side end portion PE of the airflow control plate 63 to the wafer center side, the viscosity of the resist solution becomes higher on the airflow control plate 63 side than on the wafer center side to prevent the flow of the resist solution flowing from the wafer center toward the airflow control plate 63, resulting in an increase in film thickness from the wafer center side toward the airflow control plate 63 side. Further, in the area from the wafer center side end portion PE of the airflow control plate 63 to the wafer outer periphery side, the viscosity of the resist solution becomes higher on the wafer center side end portion PE side than on the wafer outer periphery side to decrease the inflow of the resist solution to the outer periphery side, resulting in a decrease in film thickness from the wafer center side toward the wafer outer periphery side. As a result, it is considered that the film thickness distribution of the resist film along the radial direction changes to have a peak below the wafer center side end portion PE of the airflow control plate 63 as compared with the film thickness distribution of the resist film in the case of not using the airflow control plate 63.

Further, the position (peak position) where the film thickness difference between the case of using the airflow control plate 63 and the case of not using the airflow control plate 63 becomes maximum is determined depending on the position of the wafer center side end portion PE of the airflow control plate 63. Accordingly, by changing the position of the wafer center side end portion PE of the airflow control plate 63 (WY3 in FIG. 11A and FIG. 11B), the peak position can be controlled.

Note that the fourth rotation speed V4 is preferably 50 to 100 rpm as has been described. This is because when the fourth rotation speed V4 exceeds 100 rpm, the airflow caused by the rotation becomes dominant due to an increase in rotation speed, to hinder the effect of the airflow control plate 63. This is also because when the fourth rotation speed V4 is less than 50 rpm, the airflow is likely to flow to below the airflow control plate 63 to hinder generation of the obliquely downward airflow from above the center side toward below the airflow control plate 63.

Further, the effect of the height of the airflow control plate 63 from the front surface of the wafer W is considered as follows.

Figure 15:
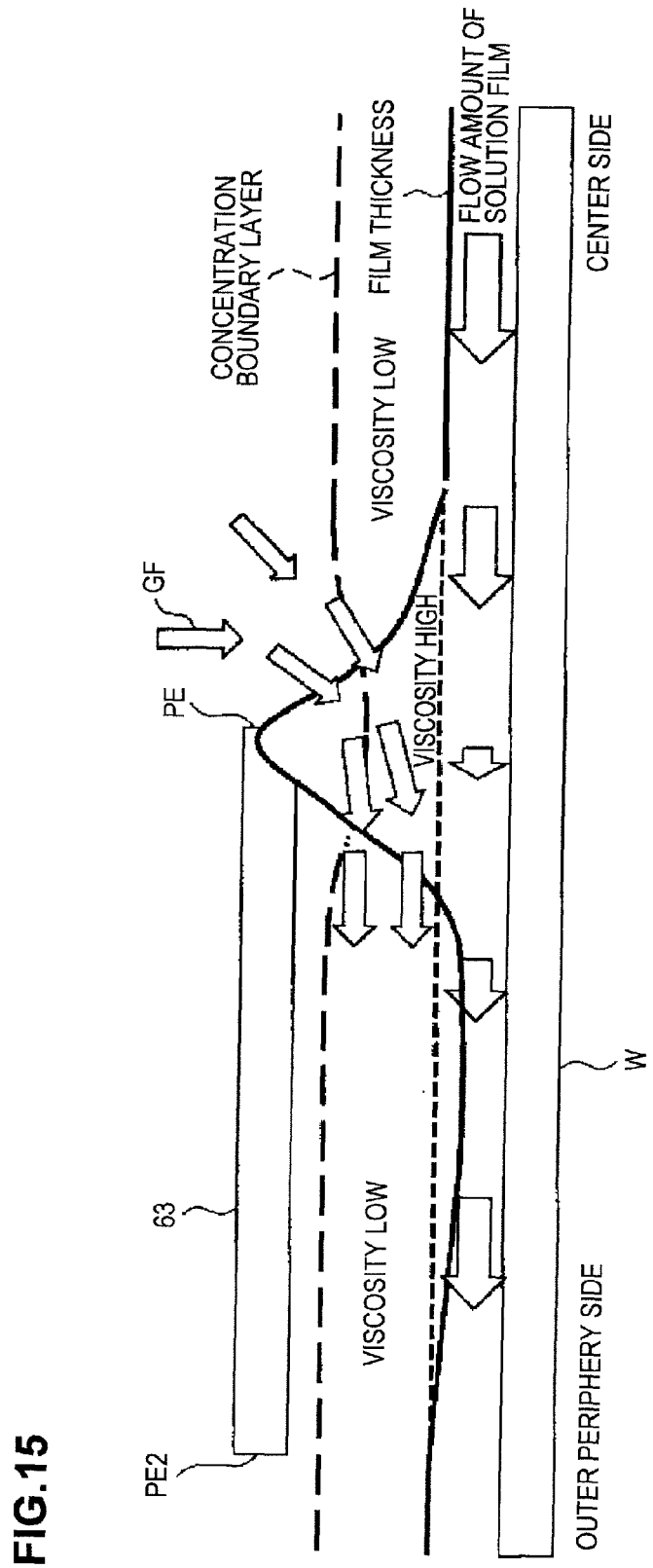
FIG. 15 is a sectional view schematically illustrating the airflow around the airflow control plate and the wafer and the film thickness distribution when the height of the airflow control plate from a front surface of the wafer is made lower.

FIG. 15 is a sectional view schematically illustrating the airflow around the airflow control plate 63 and the wafer W and the film thickness distribution when the height (HZ2 in FIG. 11B) of the lower surface of the airflow control plate 63 from the front surface of the wafer W is made lower than the height in FIG. 14.

When the height HZ2 is decreased, the obliquely downward airflow occurring from above the center side in the radial direction toward below the airflow control plate 63 further increases and the thickness of the concentration boundary layer further decreases in the area above the front surface of the wafer and located below the wafer center side end portion PE of the airflow control plate 63. However, the length along the radial direction of the area where the thickness of the concentration boundary layer decreases along the radial direction is shorter than that when the height HZ2 is large. In short, though the concentration boundary layer becomes thinner at a relatively great degree, the range where the concentration boundary layer becomes thinner is smaller. For example, when the height of the airflow control plate 63 decreases, the position (peak position) where the film thickness difference between the case of using the airflow control plate 63 and the case of not using the airflow control plate 63 becomes maximum is not greatly different, but the range of the peak (peak width) decreases and the change amount in film thickness at the peak position increases. In other words, when the height of the airflow control plate 63 from the front surface of the wafer W is decreased, the area where the film thickness changes decreases, but the change amount in film thickness near the peak increases. Conversely, when the height of the airflow control plate 63 from the front surface of the wafer W is increased, the area where the film thickness changes increases, but the change amount in film thickness near the peak decreases.

As described above, by adjusting the height of the airflow control plate 63 from the front surface of the wafer W, the film thickness of the resist film can be freely adjusted.

Note that the example that the airflow control plate 63 is moved by the drive part 64 is described in this embodiment. However, a plurality of kinds of airflow control plates with different dimensions may be provided in advance and properly used according to the film thickness distribution before control. For example, airflow control plates having a width dimension WY1 in the radial direction of, for example, 60 mm, 20 mm, and 10 mm may be provided, a preliminary experiment is carried out, for example, without using the airflow control plates, and one of the airflow control plates may be selected according to the film thickness distribution obtained by the preliminary experiment.

Further, the change amount of the film thickness of the resist film changed by the airflow control plate 63 depends on the time period for performing the fifth step S5. Accordingly, the time period for performing the fifth step S5 may be selected from among three-level set periods of, for example, 3 seconds, 4 seconds, and 5 seconds.

Second Embodiment

Next, a coating treatment method according to a second embodiment of the present invention will be described.

The coating treatment method according to this embodiment is different from the coating treatment method according to the first embodiment in that the coating treatment method according to this embodiment does not have the fifth step S5. Further, the coating treatment method according to this embodiment can be performed using the coating module described in the first embodiment.

Figure 16:
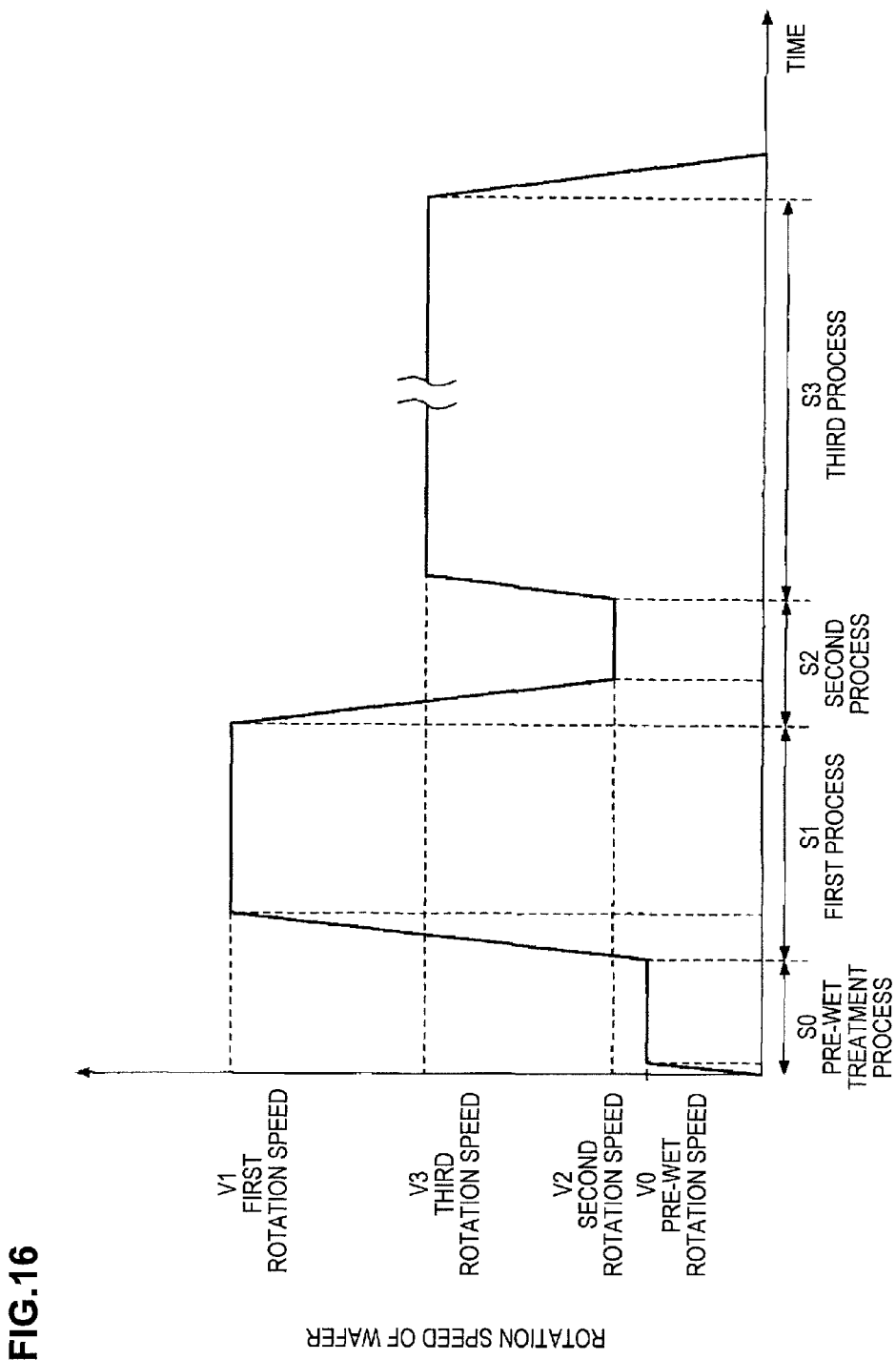
FIG. 16 is a graph showing the rotation speed of the wafer in each step of a resist coating treatment process according to a second embodiment.

FIG. 16 is a graph showing the rotation speed of the wafer in each step of the coating treatment method according to this embodiment.

The transfer of the wafer W into the coating module 23 by the transfer arm A3, a pre-wet treatment step S0, and a first step S1 can be performed similarly to the pre-wet treatment step S0 and the first step S1 in the first embodiment. Further, the state of the wafer W when the first step S1 is performed is the same as the state illustrated in FIG. 8A.

Next, a second step depicted at S2 in FIG. 16 is performed. The second step S2 is a step of rotating, after the first step S1, the wafer W at a second rotation speed V2 lower than the first rotation speed V1 to fix up the shape of the diffused resist solution PR, and the time period for performing the second step S2 at the second rotation speed V2 can be made the same as in the first embodiment.

However, in this embodiment, the airflow above the rotated wafer W may be changed by placing the airflow control plate 63 above the wafer W at the second step S2.

As illustrated using FIG. 8B in the first embodiment, the outer periphery of the resist solution reaching, for example, about only half of the distance from the center to the outer periphery of the wafer W at the first step S1 is located at substantially the same position as in the case of the first step S1 also at the second step S2.

However, by placing the airflow control plate 63 above the wafer W at the second step S2, the film thickness of the resist solution can be increased near the wafer center side end portion PE of the airflow control plate 63. Further, it is possible to place the airflow control plate 63 at an arbitrary position. Accordingly, the distribution of the film thickness of the resist solution can be controlled at the second step S2.

Next, a third step depicted at S3 in FIG. 16 is performed. The third step S3 is a step of rotating, after the second step S2, the wafer W at a third rotation speed V3 higher than the second rotation speed V2 to further diffuse the fixed up resist solution PR to the outer periphery side in the radial direction of the wafer W and shake off and dry the resist solution PR on the wafer W. The third rotation speed V3 can be made the same as in the first embodiment. The time period for performing the third step S3 is preferably, for example, about 25 seconds.

Note that the airflow control plate 63 may be placed above the wafer W at the third step S3 continuously from the second step S2.

In this embodiment, the distribution of the film thickness of the resist solution can be previously controlled at the second step S2. Therefore, it is possible to control the film thickness at an arbitrary position on the wafer W and reduce the variation in film thickness within the wafer W for the resist film formed by performing the third step S3.

Note that the example that the airflow control plate 63 is placed above the wafer W at the second step S2 has been described in this embodiment. However, the airflow control plate 63 may be located above the wafer W or fixed at a predetermined position from the time of the first step S1. More specifically, during the time when the resist solution is being supplied to the wafer W, the airflow above the rotated wafer W may be locally changed by the airflow control plate 63 provided at the predetermined position with the wafer W being rotated by the chuck drive mechanism 32.

Further, the airflow control plate is rectangular in this embodiment but may be in another shape such as a circle or the like in a plan view as will be described later.

Third Embodiment

Next, a coating module according to a third embodiment of the present invention will be described referring to FIG. 17. This coating module is different from the coating module 23 in that the airflow control plate 63 in the coating module 23 (FIG. 5 and FIG. 6) according to the first embodiment is driven not by the drive part 64 but by another drive mechanism, and is substantially the same in other points. Hereinafter, the coating module according to this embodiment will be described mainly for the difference.

Figure 17:
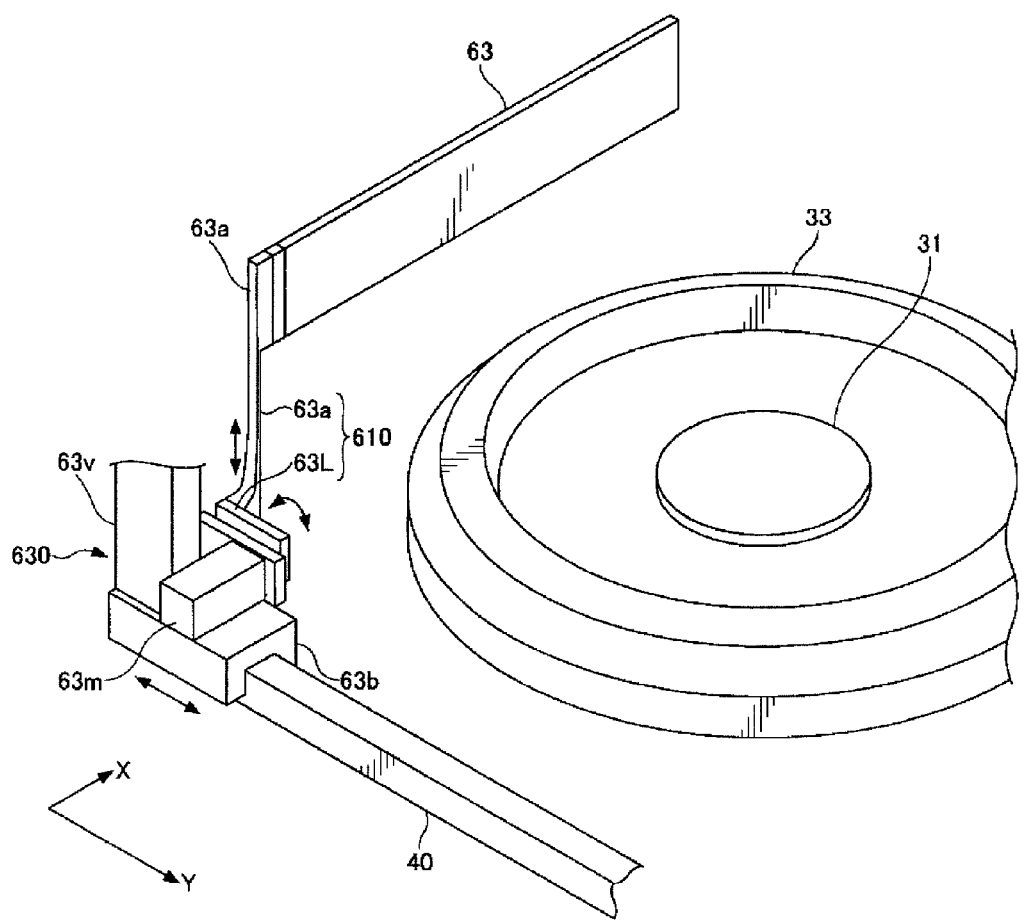
FIG. 17 is a perspective view of an essential part of a coating module according to a third embodiment of the present invention.

FIG. 17 is a schematic perspective view illustrating an airflow control plate 63 and a drive part 630 driving the airflow control plate 63 in the coating module according to this embodiment. As illustrated in FIG. 17, the airflow control plate 63 is held by a fourth arm 610. The fourth arm 610 has a link part 63L and a support rod 63a which are coupled with each other at an angle of about 90°. Therefore, the fourth arm 610 (the link part 63L and the support rod 63a) has an almost L-shape as seen from an X-axis direction. Therefore when the longitudinal direction of the link part 63L coincides with the horizontal direction, the support rod 63a extends in an almost vertical direction and the airflow control plate 63 attached to the support rod 63a almost stands upright. However, the angle formed between the link part 63L and the support rod 63a is not limited to about 90° but may be arbitrarily adjusted.

The drive part 630 has a base part 63b movable along a rail 40 extending in a Y-axis direction, a guide part 63v provided to stand upright on the base part 63b, and a motor 63m provided on the guide part 63v to be movable up and down along the guide part 63v. A rotation shaft (not illustrated) of the motor 63m is coupled to one end side of the link part 63L of the fourth arm 610. This allows the motor 63m to turn the link part 63L around the rotation shaft of the motor 63m. Accompanying the turn of the link part 63L, the support rod 63a and thus the airflow control plate 63 turn around the rotation shaft of the motor 63m.

Next, the operation of the airflow control plate 63 by the drive part 630 will be described referring to FIG. 18A to FIG. 18D. This operation is performed at the fifth step S5 of the coating treatment method according to the first embodiment described referring to FIG. 8D.

Figure 18A:
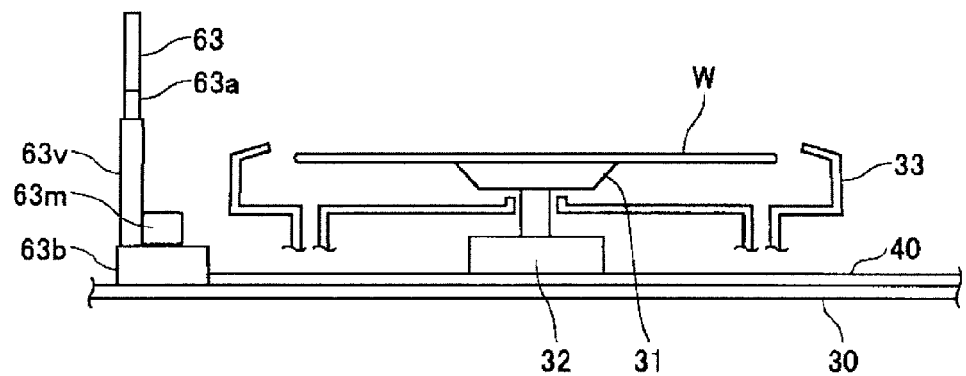
FIG. 18A is a schematic view illustrating an operation in the coating module in FIG. 17.

As illustrated in FIG. 18A, the airflow control plate 63 is, at the beginning, placed by the drive part 630 at a waiting position distant at least in a lateral direction from the wafer W held on the spin chuck 31 in the cup 33. Further, the airflow control plate 63 stands upright at the waiting position in this embodiment. The waiting position is preferably separated from the cup 33 to an extent that the airflow above the wafer W is not disturbed by the airflow control plate 63 at steps S1, S2, and S4 described in the first embodiment referring to FIG. 7 and FIG. 8A to FIG. 8C. However, if the separation distance between the airflow control plate 63 and the cup 33 is made unnecessarily large, the coating module is increased in size. Therefore it is preferable to decide the separation distance also in consideration of the space where the coating module is provided.

Figure 18B:
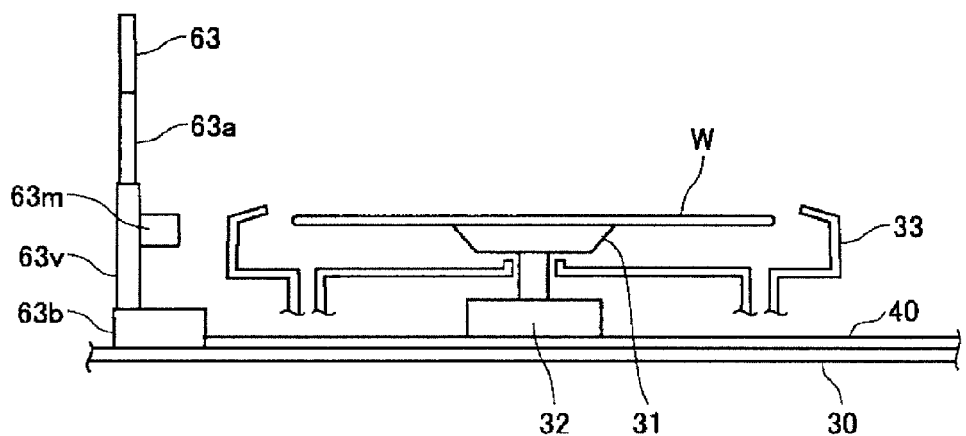
FIG. 18B is a schematic view illustrating the operation in the coating module in FIG. 17.
Figure 18C:
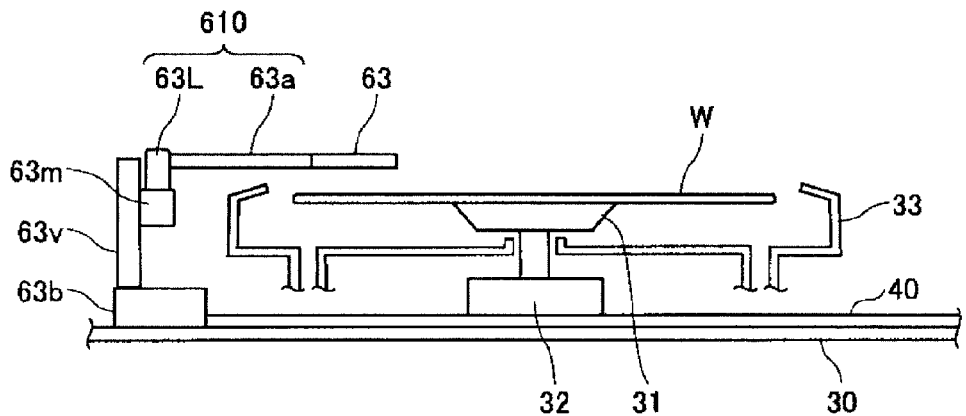
FIG. 18C is a schematic view illustrating the operation in the coating module in FIG. 17.
Figure 18D:
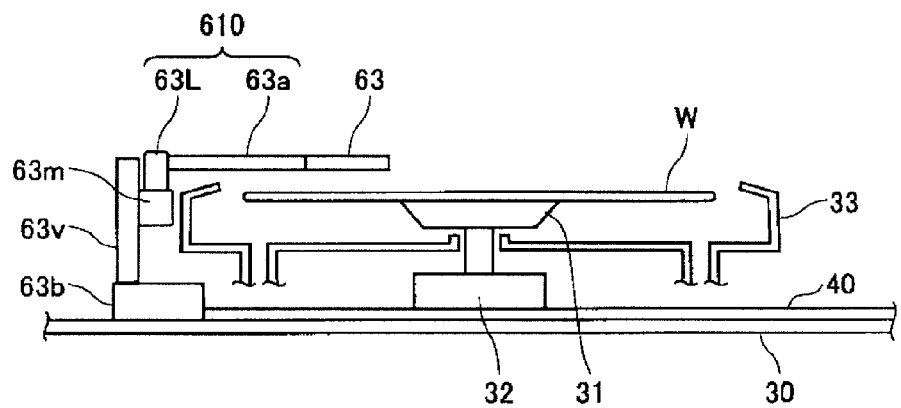
FIG. 18D is a schematic view illustrating the operation in the coating module in FIG. 17.

Next, as illustrated in FIG. 18B, the motor 63m of the drive part 630 rises to a predetermined position along the guide part 63v to place the fourth arm 610 (the link part 63L and the support rod 63a) at a position higher than the waiting position. Subsequently, as illustrated in FIG. 18C, the motor 63m is activated to rotate its rotation shaft, thereby turning the fourth arm 610 (the link part 63L and the support rod 63a) clockwise to place the airflow control plate 63 substantially horizontally above the wafer W. Further, as illustrated in FIG. 18D, the drive part 630 (the base part 63b) moves along the rail 40 to get closer to the cup 33, whereby the airflow control plate 63 is moved along the radial direction of the wafer W and is placed at the predetermined position.

Here, the height (see HZ2 in FIG. 11B) of the airflow control plate 63 from the front surface of the wafer W can be adjusted by a rise distance of the motor 63m rising along the guide part 63v. Further, the position in the horizontal direction (Y-axis direction) of the airflow control plate 63 can be adjusted by a movement distance of the base part 63b moving along the rail 40.

Further, after the finish of the above-described fifth step S5, the airflow control plate 63 can be returned to the waiting position following the reverse order to the foregoing.

The same effects as those described in the first embodiment are exhibited by the airflow control plate 63 placed at the predetermined position in the above manner. Further, in the coating module according to this embodiment, the airflow control plate 63 is held by the fourth arm 610, and the fourth arm 610 is composed of the link part 63L and the support rod 63a which are coupled with each other at an angle of about 90°. If the link part 63L is not provided and the support rod 63a is directly attached to the motor 63m, it becomes necessary to increase the distance of the motor 63m (and the support rod 63a and the airflow control plate 63) rising along the guide part 63v. In other words, when there is no link part 63L, the airflow control plate 63 cannot be placed at the predetermined height (HZ2) unless the motor 63m moves, for example, to the same height as that of the link part 63L illustrated in FIG. 18C. Therefore, the airflow control plate 63 needs to be raised by the motor 63m to a position higher than that in the case where the link part 63L is provided, thus causing a need to increase the height of the casing 30 (FIG. 5) of the coating module 23. In other words, the coating module 23 can be reduced in size due to the link part 63L.

Figure 19A:
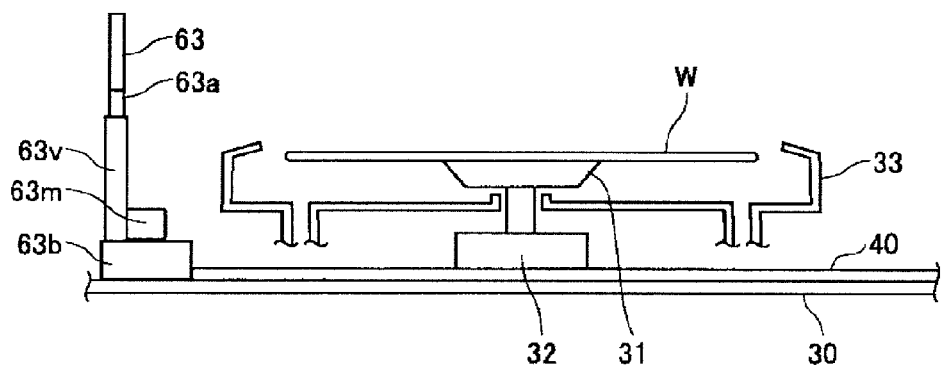
FIG. 19A is a schematic view illustrating another operation in the coating module in FIG. 17.
Figure 19B:
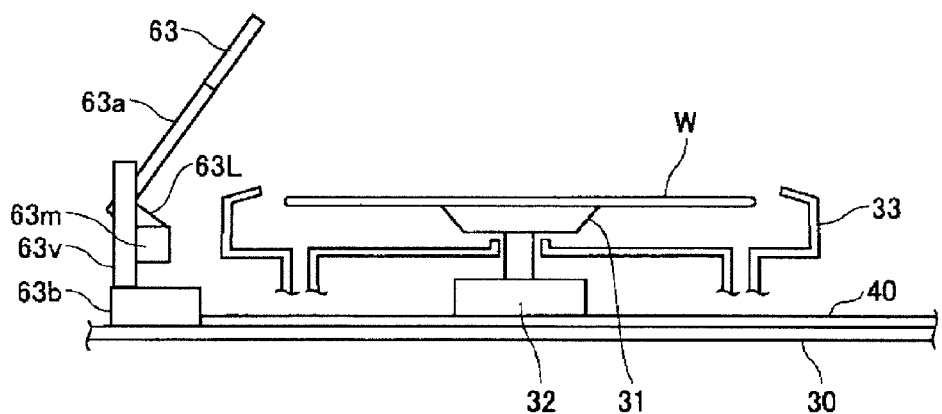
FIG. 19B is a schematic view illustrating the other operation in the coating module in FIG. 17.
Figure 19C:
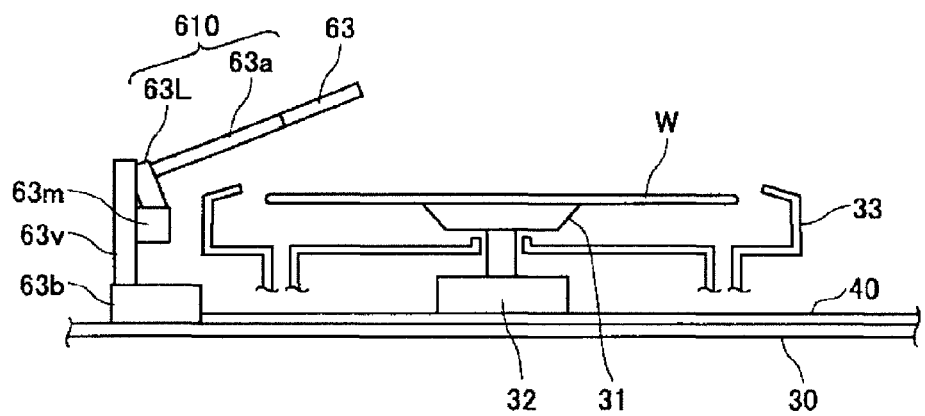
FIG. 19C is a schematic view illustrating the other operation in the coating module in FIG. 17.
Figure 19D:
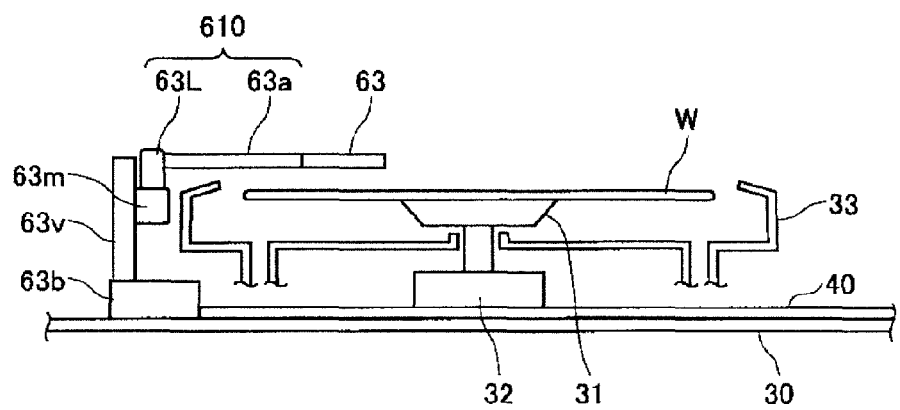
FIG. 19D is a schematic view illustrating the other operation in the coating module in FIG. 17.

Note that though the example that the airflow control plate 63 is raised, turned, and horizontally moved in sequence has been described referring to FIG. 18A to 18D, the operation of the airflow control plate 63 is not limited to that but may be performed such that the airflow control plate 63 may be concurrently raised, turned, and horizontally moved, for example, as illustrated in FIG. 19A to FIG. 19D. More specifically, in the example illustrated in FIG. 19A to FIG. 19D, the airflow control plate 63 may be placed at the predetermined position in such a manner, as illustrated in FIG. 19B to FIG. 19D starting from the waiting position illustrated in FIG. 19A, that while the motor 63m is rising along the guide part 63v and the rotation shaft of the motor 63m is being rotated to turn the fourth arm 610 and the airflow control plate 63 clockwise, the base part 63b moves in the horizontal direction along the rail 40.

Further, in the example illustrated in FIG. 18A to FIG. 18D, the order of rise and horizontal movement may be changed. More specifically, after the base part 63b moves rightward along the rail 40 and stops at a predetermined position, the motor 63m, the fourth arm 610, and the airflow control plate 63 may be raised and the fourth arm 610 and the airflow control plate 63 may be turned.

Further, the drive part 630 may be composed of a base part 63b movable along the rail 40 (see FIG. 6) extending in the Y-axis direction, a guide part 63v provided to stand upright on the base part 63b, and a motor 63m fixed at a predetermined height position along the guide part 63v. This makes it possible to place the airflow control plate 63 at the predetermined position by the turn by the motor 63m and the horizontal movement of the base part 63b without raising the motor 63m. In addition, there is an advantage that the drive part moving up and down the motor 63m becomes unnecessary.

Further, the drive part 630 may be composed of a base part 63b fixed at a predetermined position of the rail 40 (see FIG. 6) extending in the Y-axis direction, a guide part 63v provided to stand upright on the base part 63b, and a motor 63m provided on the guide part 63v to be movable up and down along the guide part 63v. This makes it possible to place the airflow control plate 63 at the predetermined position by the up-and-down movement of the motor 63m along the guide part 63v and the turn by the motor 63m. Accordingly, there is an advantage that the drive part horizontally moving the motor 63m becomes unnecessary.

Further, the drive part 630 may be composed of a base part 63b fixed at a predetermined position of the rail 40 (see FIG. 6) extending in the Y-axis direction, a guide part 63v provided to stand upright on the base part 63b, and a motor 63m fixed at a predetermined height along the guide part 63v This makes it possible to place the airflow control plate 63 at the predetermined position only by the turn by the motor 63m.

Modification Examples

Though the coating modules according to the first embodiment and the third embodiment have been described above, the airflow control plates 63 in the coating modules can be modified as follows.

Figure 20A:
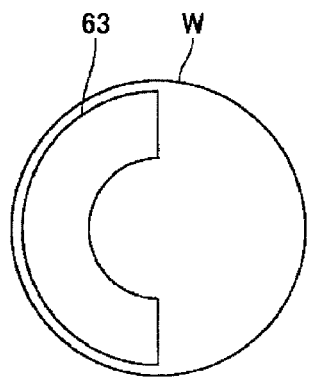
FIG. 20A is a view illustrating a modification example of the airflow control plate in the coating module according to an embodiment of the present invention.

For example, the airflow control plate 63 does not have a rectangular flat plate shape but may have a flat plate shape curved in a C-shape (or an arc shape or a semicircular annular plate shape) as illustrated in FIG. 20A. Even with this shape, it is possible to control the film thickness distribution of the resist film through the solvent concentration in the resist solution between the area below the airflow control plate 63 and the area where the airflow control plate 63 is not placed in the space above the wafer W. Note that the airflow control plate 63 is not limited to have the C-shape but may have a shape of a trapezoid or a triangle.

Figure 20B:
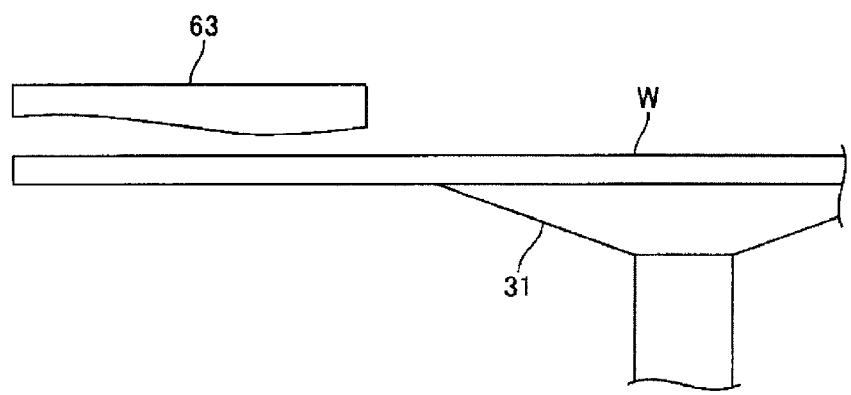
FIG. 20B is a view illustrating a modification example of the airflow control plate in the coating module according to an embodiment of the present invention.

Further, as illustrated in FIG. 20B, the lower surface of the airflow control plate 63 is not flat, but the gap between the lower surface and the front surface of the wafer W held on the spin chuck 31 may be varied. In the illustrated example, the lower surface of the airflow control plate 63 is curbed such that the gap decreases and increases again along a direction from the center toward the outer periphery of the wafer W. With this lower surface shape, on the outer periphery side of the wafer W in the space between the lower surface of the airflow control plate 63 and the front surface of the wafer W, the airflow velocity in the space can be increased to increase the evaporation amount of the solvent and thicken the resist film on the outer periphery side of the wafer W. Note that the lower surface of the airflow control plate 63 is not limited to have the curved surface but may have, for example, a plurality of inclined flat surfaces so as to vary the gap between the lower surface and the front surface of the wafer W.

Figure 20C:
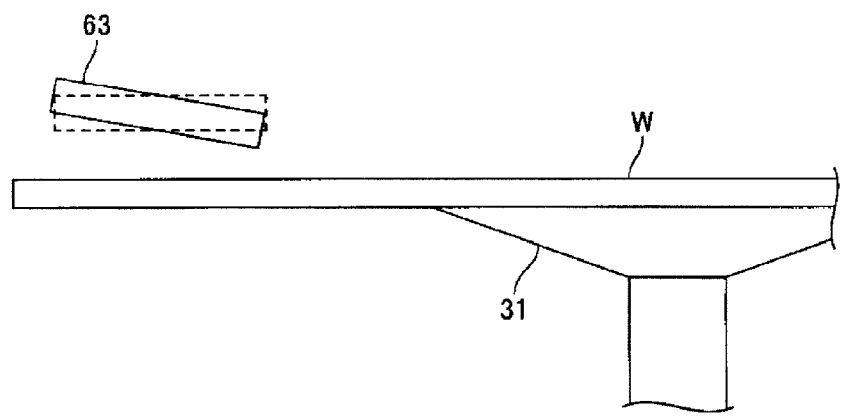
FIG. 20C is a view illustrating a modification example of the airflow control plate in the coating module according to an embodiment of the present invention.

Further, as illustrated in FIG. 20C, the airflow control plate 63 is not parallel to the wafer W but may be inclined with respect to the front surface of the wafer W. This inclination may be realized by attaching the airflow control plate 63 to the third arm 61 to be inclined at a predetermined angle in the first embodiment or may be realized by adjusting the rotation angle of the rotation shaft of the motor 63m in the third embodiment.

When the gap between the lower surface of the airflow control plate 63 and the front surface of the wafer W increases along the direction toward the outer periphery of the wafer W as illustrated in FIG. 20C, the evaporation amount of the solvent on the outer periphery side of the wafer W can be increased to thicken the resist film on the outer periphery side of the wafer W as in the description referring to FIG. 20B. Alternatively, the airflow control plate 63 may be inclined to decrease the gap between the lower surface of the airflow control plate 63 and the front surface of the wafer W along the direction toward the outer periphery of the wafer W. This makes it possible to increase the evaporation amount of the solvent on the inner periphery side of the wafer W to thicken the resist film on the inner periphery side of the wafer W.

Figure 21A:
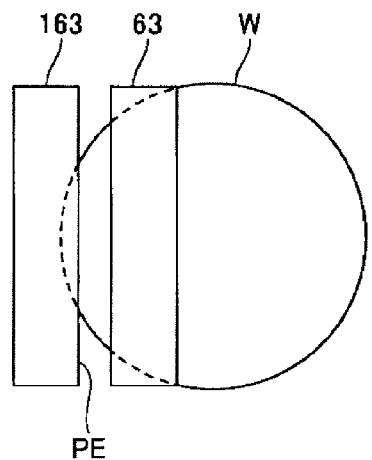
FIG. 21A is a view illustrating another modification example of the airflow control plate in the coating module according to an embodiment of the present invention.

Further, for example, as illustrated in FIG. 21A, an additional airflow control plate 163 may be provided in addition to the airflow control plate 63. Concretely, the airflow control plate 163 has almost the same size as the airflow control plate 63 and provided to be separated on the wafer outer periphery side from the airflow control plate 63. More specifically, the airflow control plate 63 is not limited to this, but the airflow control plate 163 is preferably provided at an arbitrary position above from a position of 20 mm inside to a position of 20 mm outside from the wafer outer periphery. The airflow control plate 163 thus positioned makes it possible to adjust the film thickness of the resist film at the wafer outermost peripheral portion.

Figure 21B:
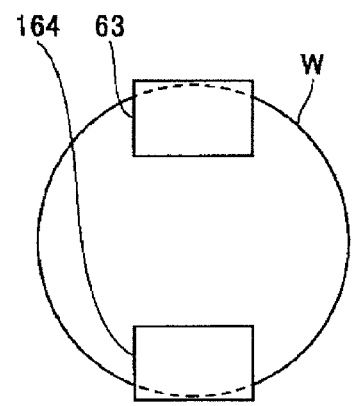
FIG. 21B is a view illustrating another modification example of the airflow control plate in the coating module according to an embodiment of the present invention.
Figure 21C:
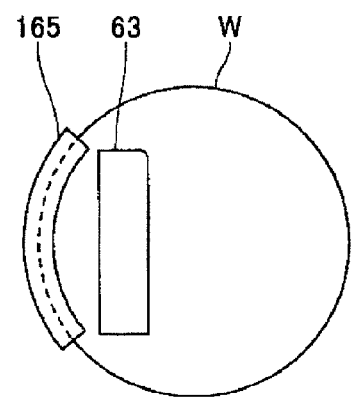
FIG. 21C is a view illustrating another modification example of the airflow control plate in the coating module according to an embodiment of the present invention.

Further, as illustrated in FIG. 21B, the airflow control plate 63 and an additional airflow control plate 164 each of which has a rectangular flat plate shape and which are placed to be symmetrical about the center of the wafer W may be provided. Furthermore, as illustrated in FIG. 21C, in addition to the airflow control plate 63 having a rectangular flat plate shape, an airflow control plate 165 having a flat plate shape curved in a C-shape (or an arc shape or a semicircular annular plate shape) may be added.

Note that the airflow control plate 163 to 165 may be provided integrally with the airflow control plate 63 and operate together with the airflow control plate 63 in one body, or may operate separately from the airflow control plate 63 by separately providing a drive part similar to the drive part 64 (or 630) provided for the airflow control plate 63. In the case where the drive part is separately provided for the airflow control plate 163 to 165, the airflow control plate 163 to 165 may be placed at a predetermined position above the wafer W, for example, before the airflow control plate 63 is placed at the predetermined position, or may be placed at a predetermined position above the wafer W after the airflow control plate 63 is placed at the predetermined position. For example, placement of the airflow control plate 63 at the predetermined position makes it possible to adjust the film thickness distribution of the resist film in the area from the wafer center side to the wafer outer periphery side end portion PE2 of the airflow control plate 63, and then placement of the airflow control plate 163 or 165 at the predetermined position makes it possible to adjust the film thickness distribution of the resist film at the wafer outermost peripheral portion.

Further, the airflow control plate 163 to 165 may be placed at the same height as the height of the airflow control plate 63 from the front surface of the wafer, or may be placed at a different height. Further, as has been described about the airflow control plate 63 referring to FIG. 20B, the gap between the lower surface of the airflow control plate 163 to 165 and the front surface of the wafer W may be varied. Furthermore, as has been described about the airflow control plate 63 referring to FIG. 20C, the gap between the lower surface of the airflow control plate 163 to 165 and the front surface of the wafer W may be varied by inclining the airflow control plate 163 to 165 with respect to the front surface of the wafer W. Further, the shape of the airflow control plate 163 to 165 is preferably decided based on the film thickness distribution of the resist film obtained, for example, by a preliminary experiment.

Next, the result of the improved film thickness uniformity by the airflow control plates 63 and 163 illustrated in FIG. 21A will be described.

Figure 22A:
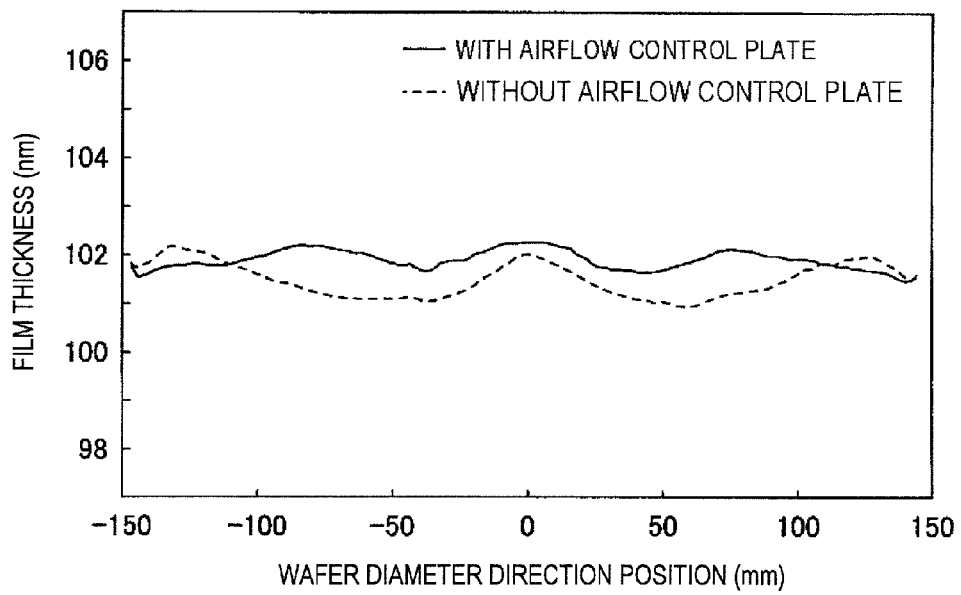
FIG. 22A is a graph showing the result of an experiment carried out for confirming the effect by the airflow control plate of the modification example.

FIG. 22A is a graph showing the film thickness distribution within a wafer of a resist film when the resist film was formed on a wafer having a diameter of 300 mm using a resist solution with a solid component (resist) concentration of 4.0%. The horizontal axis indicates the position along the diameter direction of the wafer and the vertical axis indicates the film thickness. The dotted line in the graph indicates the film thickness distribution of the resist film formed without using the airflow control plate 63 and the airflow control plate 163 for comparison, and the solid line indicates the film thickness distribution of the resist film formed using the airflow control plate 63 and the airflow control plate 163. Note that the amount of the resist solution supplied to the wafer front surface was 0.34 milliliters (ml).

As is evident from the graph, in the case of not using the airflow control plate 63 and the airflow control plate 163, the film thickness of the resist film decreases in a direction from the center (0 mm) of the wafer toward the outer periphery, becomes smallest at the position of about 60 to 70 mm from the center of the wafer, and then increases toward the outer periphery of the wafer. In contrast, in the case of using the airflow control plate 63 and the airflow control plate 163, the film thickness at the position of about 60 to 70 mm from the center of the wafer increases, and the film thickness decreases at a position near the outer periphery of the wafer (a position of 125 to 140 mm) As a result of this, the film thickness uniformity is improved to be 0.62 nm in the case of using the airflow control plate 63 and the airflow control plate 163, from 1.22 nm (maximum film thickness–minimum film thickness) in the case of not using the airflow control plate 63 and the airflow control plate 163.

Note that it is believed, in the case of using the airflow control plate 63 and the airflow control plate 163, that the film thickness increased at the position of about 60 to 70 mm from the center of the wafer by the airflow control plate 63, and the film thickness decreased at the position near the outer periphery of the wafer by the airflow control plate 163.

Figure 22B:
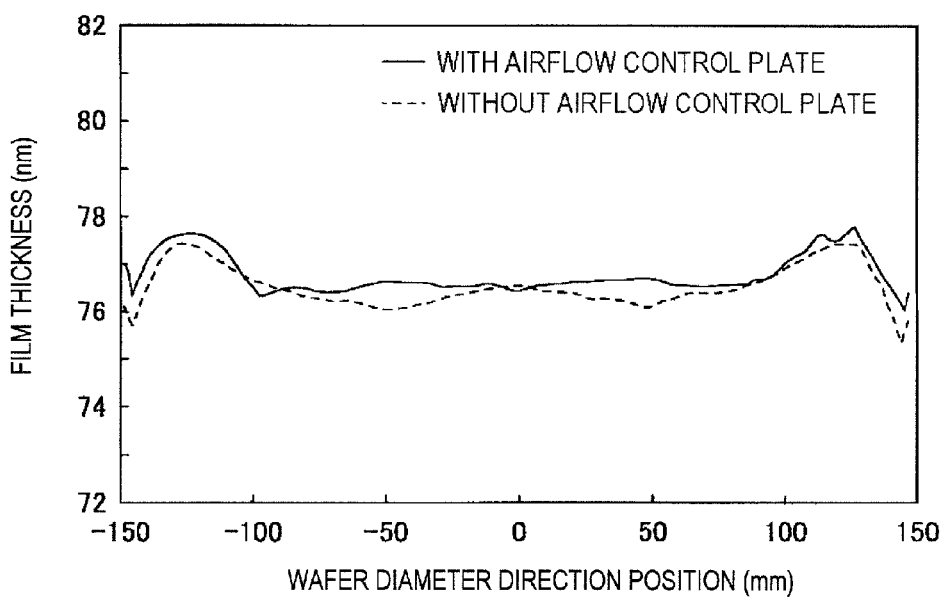
FIG. 22B is a graph showing the result of an experiment carried out for confirming the effect by the airflow control plate of the modification example.

FIG. 22B is a graph showing, similarly to FIG. 22A, the film thickness distribution within a wafer of a resist film when the resist film was formed on a wafer having a diameter of 300 mm using a resist solution with a solid component (resist) concentration of 3.5%. The amount of the resist solution supplied to the wafer front surface was 0.33 milliliters (ml).

In the result shown in FIG. 22B, the film thickness of the resist film increases at the position of 110 to 135 mm from the center of the wafer both in the case of using the airflow control plate 63 and the airflow control plate 163 and in the case of not using them. However, it is found that the film thickness increases to improve the film thickness uniformity by using the airflow control plate 63 and the airflow control plate 163 in a range down to about 75 mm from the center of the wafer. Further, at the position of about 110 to 135 mm from the center of the wafer, the film thickness does not decrease even by the airflow control plate 163 different from the result shown in FIG. 22A, but at least a great increase is not found. If using the airflow control plate 165 illustrated in FIG. 21C in place of the airflow control plate 163, the airflow can be controlled in a wider range at the position of about 110 to 135 mm from the center of the wafer, so that the improvement in film thickness distribution is expected.

Though preferred embodiments of the present invention have been described above, the present invention is not limited to the specific embodiments but can be variously changed and modified within the scope of the present invention as set forth in claims.

For example, the waiting position of the airflow control plate 63 may be at the same height as the predetermined position above the wafer W held on the spin chuck 31 as long as it is distant in a lateral direction from the wafer W held on the spin chuck 31 (the first embodiment), or may be higher or lower than the height. Further, the waiting position may be at the same height as or lower than that of the cup 33 (or the upper surface of the wafer W held on the spin chuck 31). This position can be realized by the drive part 630 in the third embodiment, or realized by providing a raising and lowering mechanism for the drive part 64 in the first embodiment. Further, the airflow control plate 63 is not limited to be placed horizontally (the first embodiment) or vertically (the third embodiment) at the waiting position, but may be inclined at a predetermined angle with respect to the horizontal direction.

Further, the semiconductor wafer is used as the substrate to be treated in the above embodiments, but the present invention is applicable not only to this but also to another substrate, for example, a glass substrate for flat panel display.

What is claimed is:

1. A coating treatment method of supplying a coating solution to a front surface of a rotated substrate and diffusing the supplied coating solution to an outer periphery side of the substrate to thereby apply the coating solution on the front surface of the substrate, said method comprising:
   a first step of controlling a supply of the coating solution to the front surface of the substrate with the substrate being rotated at a first rotation speed that diffuses the coating solution toward the outer periphery side of the substrate;
   a second step of controlling, after said first step, to stop the supply of the coating solution at a point in time before an outer periphery of the coating solution reaches the outer periphery side of the substrate, with the substrate being decelerated to a second rotation speed lower than the first rotation speed or with the substrate being rotated at the second rotation speed that increases a thickness at the outer periphery of the coating solution; and
   a third step of controlling, after said second step, to rotate the substrate at a third rotation speed higher than the second rotation speed that diffuses the coating solution to reach the outer periphery side of the substrate,
   wherein an airflow above the rotated substrate is locally changed by moving an airflow control plate provided to be movable to a predetermined position above the substrate, to the predetermined position by a drive part after stop of the supply of the coating solution to the front surface of the substrate.

2. The coating treatment method as set forth in claim 1, wherein said third step comprises:
   a fourth step of rotating the substrate at the third rotation speed; and
   a fifth step of rotating, after said fourth step, the substrate at a fourth rotation speed lower than the third rotation speed,
   wherein in said fifth step, the airflow above the rotated substrate is locally changed by placing the airflow control plate at the predetermined position by the drive part while the substrate is being rotated at the fourth rotation speed.

3. The coating treatment method as set forth in claim 2, wherein a rotation speed of the substrate when the airflow control plate is placed at the predetermined position is 50 to 100 rpm.

4. A non-transitory computer-readable recording medium having a program recorded thereon for causing a computer to execute a coating treatment method of supplying a coating solution to a front surface of a rotated substrate and diffusing the supplied coating solution to an outer periphery side of the substrate to thereby apply the coating solution on the front surface of the substrate,
   wherein said coating treatment method comprises:
   a first step of controlling a supply of the coating solution to the front surface of the substrate with the substrate being rotated at a first rotation speed that diffuses the coating solution toward the outer periphery side of the substrate;
   a second step of controlling, after said first step, to stop the supply of the coating solution at a point in time before an outer periphery of the coating solution reaches the outer periphery side of the substrate, with the substrate being decelerated to a second rotation speed lower than the first rotation speed or with the substrate being rotated at the second rotation speed that increases a thickness at the outer periphery of the coating solution; and a third step of controlling, after said second step, to rotate the substrate at a third rotation speed higher than the second rotation speed that diffuses the coating solution to reach the outer periphery side of the substrate, wherein an airflow above the rotated substrate is locally changed by moving an airflow control plate provided to be movable to a predetermined position above the substrate, to the predetermined position by a drive part after stop of the supply of the coating solution to the front surface of the substrate.

* * * * *